(12) United States Patent
Han et al.

(10) Patent No.: US 9,165,980 B2
(45) Date of Patent: Oct. 20, 2015

(54) ORGANIC LIGHT-EMITTING DEVICE AND OF PREPARING THE SAME

(71) Applicant: Samsung Display Co., Ltd., Yongin, Gyeonggi-Do (KR)

(72) Inventors: Kyul Han, Yongin (KR); Sang-Woo Lee, Yongin (KR); Hyo-Yeon Kim, Yongin (KR); Hye-Yeon Shim, Yongin (KR); Heun-Seung Lee, Yongin (KR); Sang-Woo Pyo, Yongin (KR); Ji-Hwan Yoon, Yongin (KR)

(73) Assignee: Samsung Display Co., Ltd., Samsung-ro, Giheung-Gu, Yongin-si, Gyeonggi-Do (KR)

( * ) Notice: Subject to any disclaimer, the term of this patent is extended or adjusted under 35 U.S.C. 154(b) by 15 days.

(21) Appl. No.: 14/057,652

(22) Filed: Oct. 18, 2013

(65) Prior Publication Data
US 2014/0191209 A1 Jul. 10, 2014

(30) Foreign Application Priority Data
Jan. 4, 2013 (KR) ........................ 10-2013-0001309

(51) Int. Cl.
*H01L 29/08* (2006.01)
*H01L 21/00* (2006.01)
*H01L 27/32* (2006.01)
*H01L 51/50* (2006.01)
*H01L 51/56* (2006.01)
*H01L 51/52* (2006.01)

(52) U.S. Cl.
CPC ........ *H01L 27/3211* (2013.01); *H01L 51/5064* (2013.01); *H01L 51/5265* (2013.01); *H01L 51/56* (2013.01)

(58) Field of Classification Search
CPC .................................................... H01L 27/0207
USPC .............................................. 257/40; 438/34
See application file for complete search history.

(56) References Cited

U.S. PATENT DOCUMENTS

| | | | |
|---|---|---|---|
| 7,547,462 B2 | 6/2009 | Kim et al. | |
| 7,615,790 B2 | 11/2009 | Lee | |
| 2003/0044639 A1 * | 3/2003 | Fukuda | ........................ 428/690 |
| 2007/0141396 A1 | 6/2007 | Chun et al. | |
| 2009/0085470 A1 | 4/2009 | Song et al. | |
| 2011/0180792 A1 | 7/2011 | Lee et al. | |

FOREIGN PATENT DOCUMENTS

| | | |
|---|---|---|
| KR | 10-2005-0082644 A | 8/2005 |
| KR | 10-2007-0036994 A | 4/2007 |
| KR | 10-2007-0068147 A | 6/2007 |
| KR | 10-0879476 B1 | 1/2009 |
| KR | 10-2009-0097464 A | 9/2009 |
| KR | 10-2010-0037572 A | 4/2010 |

* cited by examiner

*Primary Examiner* — Fernando L Toledo
*Assistant Examiner* — Neil Prasad
(74) *Attorney, Agent, or Firm* — Robert E. Bushnell, Esq.

(57) ABSTRACT

An organic light emitting diode (OLED) and a method of manufacturing the same. An auxiliary layer comprising a high density metallic compound and an emission layer are formed by a laser induced thermal imaging (LITI) process. The LITI process reduces manufacturing costs and time by eliminating the need for a mask patterning process. The metallic compound has a density of 2 g/cm$^3$ or greater to promote adhesion and improve interfacial planarization. This results in improved luminance uniformity (i.e. luminance mura) between pixels within an OLED display device.

20 Claims, 3 Drawing Sheets

ORGANIC LIGHT-EMITTING DEVICE AND OF PREPARING THE SAME

CLAIM OF PRIORITY

This application makes reference to, incorporates the same herein, and claims all benefits accruing under 35 U.S.C. §119 from an application earlier filed in the Korean Intellectual Property Office filed on Jan. 4, 2013 and there duly assigned Serial No. 10-2013-0001309.

BACKGROUND OF THE INVENTION

1. Field of the Invention

One or more embodiments of the present invention relates to an organic light emitting device and a method of preparing the same.

2. Description of the Related Art

Organic light-emitting devices (OLEDs), which are self-emitting devices, have advantages such as wide viewing angles, excellent contrast, quick response, high brightness, excellent driving voltage properties, and can provide multi-colored images.

A typical OLED has a structure including a substrate, and an anode, a hole transport layer (HTL), an emission layer (EML), an electron transport layer (ETL), and a cathode which are sequentially stacked on the substrate. In this regard, the HTL, the EML, and the ETL are organic thin films thrilled of organic compounds.

An operating principle of an OLED having the above-described structure is as follows.

When a voltage is applied between the anode and the cathode, holes injected from the anode move to the EML via the HTL, and electrons injected from the cathode move to the EML via the ETL. The holes and electrons recombine in the EML to generate excitons. When the excitons drop from an excited state to a ground state, light is emitted.

SUMMARY OF THE INVENTION

One or more embodiments includes a high-performance organic light emitting device substantially preventing luminance non-uniformity defects (luminance mura) and having a simple manufacturing process, and a method of manufacturing the organic light-emitting device.

According to one aspect of the present invention, there is provided an organic light emitting device that includes a substrate including a first subpixel region, a second subpixel region, and a third subpixel region, a plurality of first electrodes separately arranged in the first subpixel region, the second subpixel region, and the third subpixel region of the substrate, a second electrode arranged opposite the first electrode, a first emission layer (EML) arranged in the first subpixel region to and emit light having a first color, a second emission layer arranged in the second subpixel region to emit light having a second color, a first layer arranged as a common layer with respect to the first subpixel region, the second subpixel region, and the third subpixel region and at least one of a first auxiliary layer and a second auxiliary layer, the first auxiliary layer may be arranged between the first emission layer and the first layer, contact a surface of the first layer and include a first metallic compound to facilitate transportation of electric charges from the first electrode to the first emission layer, and the second auxiliary layer may be arranged between the second emission layer and the first layer, contact the surface of the first layer and include a second metallic compound to facilitate transportation of electric charges from the first electrode to the second emission layer.

The first metal compound may be a metal compound which makes an imaginary first thin film exclusively including (consisting of) the first metal compound to have a thin film density of 2 g/cm$^3$ or greater and the second metal compound may be a metal compound which makes an imaginary second thin film exclusively including (consisting of) the second metal compound to have a thin film density of 2 g/cm$^3$ or greater.

The first electrode may be a hole injection electrode, the first layer comprises a light emitting material to emit light having a third color, the first metallic compound and the second metallic compound are oxidizing metallic compounds and the second electrode is an electron injection electrode. The first metallic compound and the second metallic compound may each independently be an oxide or a halide that includes at least one of a Group 5 element, a Group 6 element, a Group 7, iron (Fe), antimony (Sb), and copper (Cu). The first metallic compound and the second metallic compound may independently include at least one of WO, $W_2O_3$, $WO_2$, $WO_3$, $W_2O_5$, VO, $V_2O_3$, $VO_2$, $V_2O_5$, MoO, $Mo_2O_3$, $MoO_2$, $MoO_3$, $Mo_2O_5$, $ReO_3$, $FeCl_3$, $SbCl_5$, and CuI. The first auxiliary layer may also include a first organic hole transport material and the second auxiliary layer may also include a second organic hole transport material. The first color may be red, the second color may be green, and the third color may be blue, and light having the third color may be emitted from the first layer.

The organic light emitting device may instead also include a second layer arranged between the first layer and the second electrode and being arranged as a common layer with respect to the first subpixel region, the second subpixel region, and the third subpixel region, the second layer comprising a light emitting material to emit light having a third color, wherein the first electrodes may be electron injection electrodes, the first layer may be an electron transport layer, the first metallic compound and the second metallic compound may be reducing metallic compounds, and the second electrode may be a hole injection electrode. The first metallic compound and the second metallic compound may each independently be a halide, an oxide, a nitride, an oxynitride or a salt comprising at least one of an alkali metal and an alkaline earth metal. The first metallic compound and the second metallic compound may each independently be one of LiF, KF, CsF, RbF, NaF, $LiO_2$, $Li_2O_2$, $Rb_2O_2$, $Cs_2O$, $LiAlO_2$, $LiBO_2$, LiCl, RbCl, NaCl, KCl, CsCl, $KAlO_2$, $Na_2WO_4$, $K_2SiO_3$, $Li_2CO_3$, $LiCO_3$, $Na_2CO_3$, $NaCO_3$, $K_2CO_3$, $KCO_3$, $RbCO_3$, $RbCO_3$, $Cs_2CO_3$, $CsCO_3$, BeCO, $BeCO_3$, MgCO, $MgCO_3$, CaO, $Ca_2CO_3$, $CaCO_3$, SrCO, $SrCO_3$, BaCO, and $BaCO_3$. The first auxiliary layer may also include a first organic electron transport material and the second auxiliary layer may also include a second organic electron transport material. The first color may be red, the second color may be green, the third color may be blue, and light having the third color may be emitted from the second layer.

According to another aspect of the present invention, there is provided a method of manufacturing an organic light emitting device, including forming a plurality of the first electrodes in a first subpixel region, a second subpixel region, and a third subpixel region, respectively on a substrate, forming a first layer as a common layer with respect to the first subpixel region, the second subpixel region, and the third subpixel region, forming at least one of a first auxiliary layer and a second auxiliary layer, wherein the first auxiliary layer may be arranged between a first emission layer and the first layer, contact a surface of the first layer and include a first metallic compound to facilitate transportation of electric charges from the first electrode to the first emission layer, and wherein the second auxiliary layer may be arranged between a second emission layer and the first layer, contact the surface of the first layer and include a second metallic compound to facilitate transportation of electric charges from the first electrode to the second emission layer, forming the first emission layer in the first subpixel region to emit light of a first color, forming the second emission layer in the second subpixel region to emit light of a second color and forming a second electrode opposite to the first electrodes.

The first auxiliary layer and the second auxiliary layer may be formed by a laser induced thermal imaging technique. The first metal compound may be a metal compound which makes a first imaginary thin film exclusively including (consisting of) the first metal compound to have a thin film density of 2 g/cm$^3$ or greater and the second metal compound may be a metal compound which makes a imaginary second thin film exclusively including (consisting of) the second metal compound to have a thin film density of 2 g/cm$^3$ or greater.

The first electrodes may be hole injection electrodes, the first layer may be a common layer comprising a light emitting material to emit light of a third color, the first metallic compound and the second metallic compound may be oxidizing metallic compounds and the second electrode may be an electron injection electrode. The first metallic compound and the second metallic compound may each independently include at least one of WO, $W_2O_3$, $WO_2$, $WO_3$, $W_2O_5$, VO, $V_2O_3$, $VO_2$, $V_2O_5$, MoO, $Mo_2O_3$, $MoO_2$, $MoO_3$, $Mo_2O_5$, $ReO_3$, $FeCl_3$, $SbCl_5$, and CuI.

Alternatively, the method may also include forming a second layer between the first layer and the second electrode, the second layer may be a common layer with respect to the first subpixel region, the second subpixel region, and the third subpixel region, the second layer may include a light emitting material to emit light of a third color, the first electrodes may be electron injection electrodes, the first layer may be an electron transport layer, the first metallic compound and the second metallic compound may be reducing metallic compounds; and the second electrode may be a hole injection electrode. The first metallic compound and the second metallic compound may each independently include at least one of LiF, KF, CsF, RbF, NaF, $LiO_2$, $Li_2O_2$, $Rb_2O_2$, $Cs_2O$, $LiAlO_2$, $LiBO_2$, LiCl, RbCl, NaCl, KCl, CsCl, $KAlO_2$, $Na_2WO_4$, $K_2SiO_3$, $Li_2CO_3$, $LiCO_3$, $Na_2CO_3$, $NaCO_3$, $K_2CO_3$, $KCO_3$, $RbCO_3$, $RbCO_3$, $Cs_2CO_3$, $CsCO_3$, BeCO, $BeCO_3$, $MgCO$, $MgCO_3$, CaO, $Ca_2CO_3$, $CaCO_3$, SrCO, $SrCO_3$, BaCO and $BaCO_3$.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings, in which like reference symbols indicate the same or similar components, wherein.

DETAILED DESCRIPTION OF THE INVENTION

As used herein, the term "and/or" includes any and all combinations of one or more of the associated listed items.

Expressions such as "at least one of," when preceding a list of elements, modify the entire list of elements and do not modify the individual elements of the list.

Hereinafter, description of structures of the organic light emitting devices and a method of manufacturing the same, according to embodiments of the present invention, will be described with reference to FIGS. 1 to 3.

Figure 1:
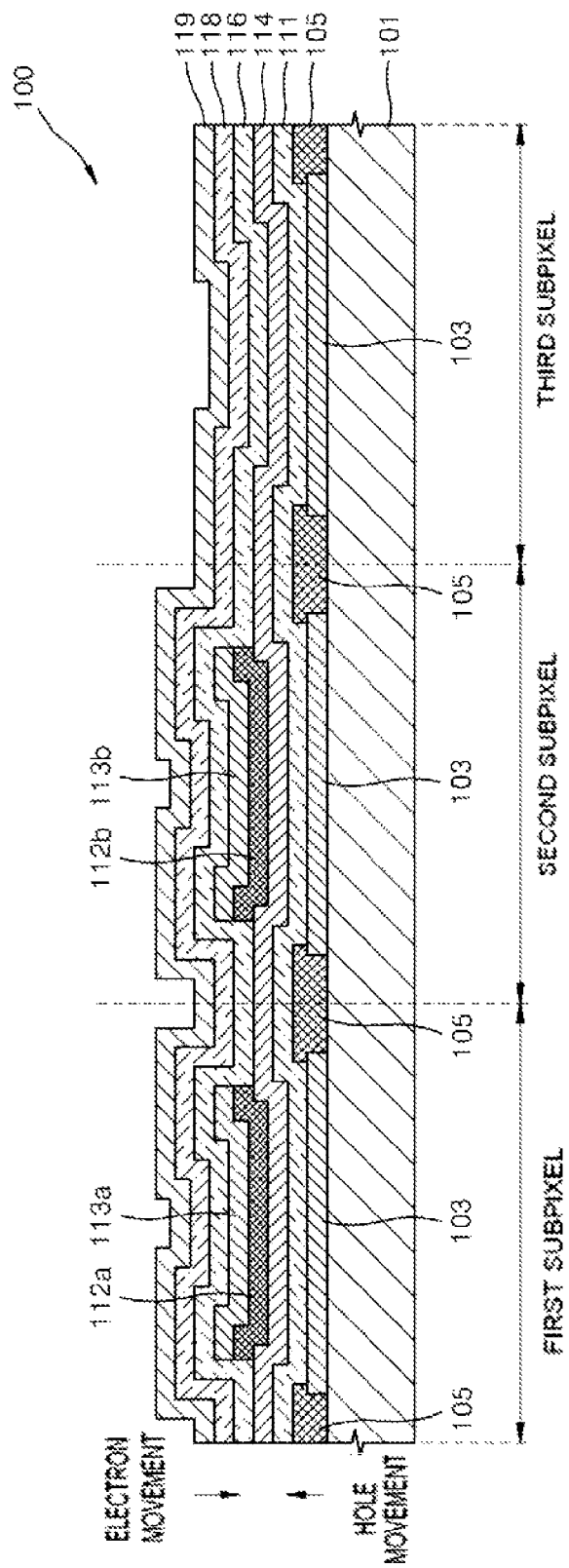
FIG. 1 is a cross-sectional view schematically showing an organic light emitting device according to a first embodiment of the present invention.

Referring to FIG. 1, a substrate 101 of an organic light emitting device 100 includes a first subpixel region, a second subpixel region, and a third subpixel region. A plurality of first electrodes 103 are disposed as separate patterns in the first subpixel region, the second subpixel region and the third subpixel region, respectively. A pixel defining layer 105 is formed on an edge of each of the first electrodes 103 to define the first subpixel region, the second subpixel region, and the third subpixel region. A hole injection and transport layer 111 and a first layer 114 are sequentially formed as common layers with respect to the entirety of the first subpixel region, the second subpixel region, and the third subpixel region. In the first subpixel region, a first auxiliary layer 112a contacting a surface of the first layer 114 is formed, and a first emission layer (EML) 113a emitting the light having a first color is formed on the first auxiliary layer 112a. In the second subpixel region, a second auxiliary layer 112b contacting the surface of the first layer 114 is formed, and a second EML 113b emitting the light having a second color is formed on the second auxiliary layer 112b. Also, as common layers for all of the first subpixel region, the second subpixel region, and the third subpixel region, an electron transport layer (ETL) 116, an electron injection layer 118, and a second electrode 119 are sequentially formed. In FIG. 1, the first electrode 103 of the organic light emitting device 100 is a hole injection electrode for injecting holes, and the second electrode 119 is an electron injection electrode for injecting electrons. Directions of movements of the holes and the electrons are shown in FIG. 1.

As used herein, the term "common layer" as used herein refers to a layer that is not a separate pattern for each of the first subpixel region, the second subpixel region, and the third subpixel region, rather, that is formed over all of the first subpixel region, the second subpixel region, the third subpixel region.

The light having the first color, the light having the second color, and the light having a third color may be, for example, red, green and blue respectively. Accordingly, the organic light emitting device may emit in full color. The light having the first color, the light having the second color, and the light having the third color may be in any of a variety of colors, not limited to the red light, the green light, and the blue light, provided that a mixed light thereof may be a white light.

Substrate 101 generally used in the organic light emitting device may be used such as a glass substrate or a transparent plastic substrate having excellent mechanical strength, thermal stability, transparency, surface finish, handlability, and waterproof property may be used. The plurality of first electrodes 103 are separately patterned in the first subpixel region, the second subpixel region, and the third subpixel region, respectively, on the substrate 101. The first electrode 103 may be formed by providing a first electrode material on the first substrate 101 by using a deposition technique or a sputtering technique. Since the first electrode 103 is a hole injection electrode, a material for first electrode 103 may be selected from materials having a high work function.

The first electrode 103 may include indium tin oxide (ITO), indium zinc oxide (IZO), tin oxide ($SnO_2$), zinc oxide (ZnO), and the like. In some embodiments, as a semi-transparent electrode, the first electrode 103 may be formed in the form of a thin film including at least one metal selected from among magnesium (Mg), aluminum (Al), aluminum-lithium (Al—Li), calcium (Ca), magnesium-indium (Mg—In), magnesium-silver (Mg—Ag), and the like.

The first electrode 103 as such may be manufactured as a transparent electrode, a semi-transparent electrode or a reflective electrode, but the present invention is in no way limited thereto.

The pixel defining layers 105 are formed on edges of the plurality of the first electrodes 103. The pixel defining layers 105 define pixel domains and may include various known organic insulating materials (for example, silicon-based materials), inorganic insulating materials, or organic/inorganic composite insulating materials.

The hole injection and transport layer 111 are formed as common layers on the plurality of the first electrodes 103. The hole injection and transport layer 111 may have two or more layers, for example, a hole injection layer (HIL) including a hole injection material and a hole transport layer (HTL) including hole transport material, or may be a single layer including at least one of a hole injection material and a hole transport material.

The hole injection and transport layer 111 may be formed on the plurality of the first electrodes 103 by using vacuum deposition, spin coating, casting, Langmuir-Blodget (LB), inkjet printing, laser printing, laser induced thermal imaging (LITI), or the like. When the hole injection and transport layer 111 are formed using vacuum deposition, vacuum deposition conditions may vary according to the material that is used to form the target hole injection and transport layer 111, and the desired structure and thermal properties of the hole injection and transport layer 111. For example, vacuum deposition may be performed at a temperature of about 100° C. to about 500° C., a pressure of about $10^{-8}$ torr to about $10^{-3}$ torr, and a deposition rate of about 0.01 Å/sec to about 100 Å/sec, however the conditions are not limited thereto.

If the hole injection and transport layer 111 is formed by using a spin coating technique, coating conditions may vary according to the compound that is used to form the target hole injection and transport layer 111, and the desired structure and thermal properties of the hole injection and transport layer 111. For example, the coating rate may be about 2000 rpm to about 5000 rpm, and a temperature at which heat treatment is performed to remove a solvent after coating may be about 80° C. to about 200° C., however, the conditions are not limited thereto.

Non-limiting examples of the material that may be used to form the hole injection and transport layer 111 are N,N'-diphenyl-N,N'-bis-[4-(phenyl-m-tolyl-amino)-phenyl]-biphenyl-4,4'-diamine (DNTPD), phthalocyanine compound such as copper phthalocyanine, m-MTDATA [4,4',4"-tris(3-methylphenylphenylamino)triphenylamine], Pani/DBSA (Polyaniline/Dodecylbenzenesulfonic acid), PEDOT/PSS (Poly(3,4-ethylenedioxythiophene)/Poly(4-styrenesulfonate), Pani/CSA (Polyaniline/Camphor sulfonicacid); and PANI/PSS (Polyaniline)/Poly(4-styrenesulfonate).

Non-limiting examples of the hole transport material are N-phenylcarbazole, polyvinylcarbazole, carbazole derivatives, n n'-bis(3-methylphenyl)-n n'-diphenyl-[1 1'-biphenyl]-4 4'-diamine (TPD), 4,4',4"-tris(N-carbazolyl)triphenylamine (TCTA), and N,N'-di(1-naphthyl)-N,N'-diphenylbenzidine (NPB).

The hole injection and transport layer 111 may include at least one of compounds represented by Formula 300 below and Formula 350 below.

<Formula 300>

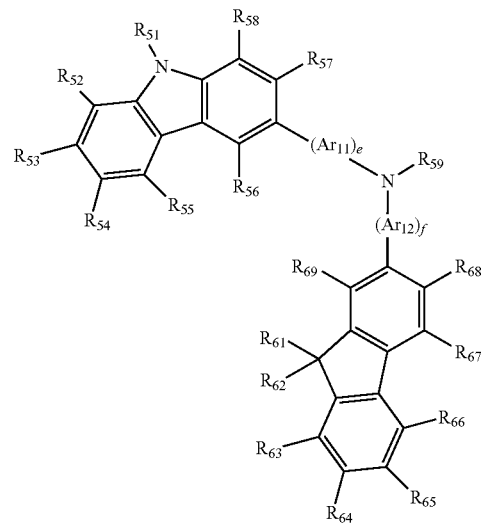

<Formula 350>

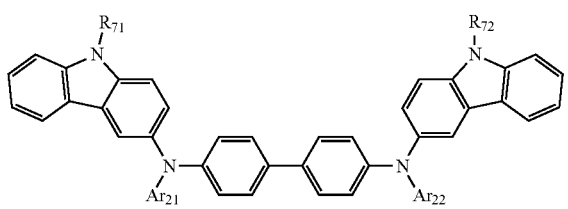

In Formula 300, $Ar_{11}$ and $Ar_{12}$ may each independently be a substituted or unsubstituted $C_6$-$C_{60}$ arylene group. For example, $Ar_{11}$ and the $Ar_{12}$ may each independently be a substituted or unsubstituted phenylene group, a substituted or unsubstituted naphthalene group, a substituted or unsubstituted fluorenylene group, or a substituted or unsubstituted anthrylene group, but are not limited thereto. At least one substituted group of the substituted phenylene group, the substituted naphthalene group, the substituted fluorenylene group, and the substituted anthrylene group may be a hydrogen atom, a deuterium atom, a halogen atom, a hydroxyl group, a cyano group, a nitro group, an amino group, an amidino group, a hydrazine, a hydrazone, a carboxylic group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, an anthryl group, or a phenanthrenyl group, but are not limited thereto.

In Formula 350, $Ar_{21}$ and $Ar_{22}$ may each independently be a substituted or unsubstituted $C_6$-$C_{60}$ aryl group, or a substituted or unsubstituted $C_2$-$C_{60}$ heteroaryl group. For example, $Ar_{21}$ and $Ar_{22}$ may each independently be a substituted or unsubstituted phenyl group, a substituted or unsubstituted naphthyl group, a substituted or unsubstituted phenanthrenyl group, a substituted or unsubstituted anthryl group, a substituted or unsubstituted pyrenyl group, a substituted or unsubstituted chrysenyl group, a substituted or unsubstituted fluorenyl group, a substituted or unsubstituted carbazoyl group, a substituted or unsubstituted dibenzofuranyl group, or a substituted or unsubstituted dibenzothiophenyl group. Herein, at least one substituted group of the substituted phenyl, the substituted naphthyl group, the substituted phenanthrenyl group, the substituted anthryl group, the substituted pyrenyl group, the substituted chrysenyl group, the substituted fluorenyl group, the substituted carbazoyl group, the substituted dibenzofuranyl group, and the substituted dibenzothiophenyl group may be selected from a deuterium atom, a halogen atom, a hydroxyl group, a cyano group, a nitro group, an amino group, an amidino group, a hydrazine group, a hydrazone, a carboxyl group or a salt thereof, a sulfonic acid group or a salt thereof, a phosphoric acid group or a salt thereof, a $C_1$-$C_{10}$ alkyl group, a $C_1$-$C_{10}$ alkoxyl group, a phenyl group, a naphthyl group, a fluorenyl group, a phenanthrenyl group, an anthryl group, a triphenylenyl group, a pyrenyl group, a chrysenyl group, an imidazoyl group, an imidazolinyl group, an imidazopyridinyl group, an imidazopyrimidyl group, a pyridinyl group, a pyrazinyl group, a pyrimidinyl group, and an indolyl group; and a phenyl group, a naphthyl group, a fluorenyl group, a phenanthrenyl group, an anthryl group, a triphenylenyl group, a pyrenyl group, a chrysenyl group, an imidazoyl group, an imidazolinyl group, an imidazopyridinyl group, an imidazopyrimidinyl group, a pyridinyl group, a pyrazinyl group, a pyrimidinyl group, and an indolyl group, substituted with at least one of a deuterium atom, a halogen atom, a hydroxyl group, a cyano group, a nitro group, an amino group, an amidino group, a hydrazine, a hydrazone, a carboxyl group and a salt thereof, a sulfonic acid group or a salt thereof, a phosphoric acid group or a salt thereof, a $C_1$-$C_{10}$ alkyl group, and a $C_1$-$C_{10}$ alkoxyl group.

In Formula 300, e and f may each independently be an integer from 0 to 5, or 0, 1 to 2. For example, e may be 1, and f may be 0, but e and f are not limited thereto.

In Formulas 300 and 350, $R_{51}$ to $R_{58}$, $R_{61}$ to $R_{69}$, $R_{71}$, and $R_{72}$ may each independently be a hydrogen atom, a deuterium atom, a halogen atom, a hydroxyl group, a cyano group, a nitro group, an amino group, an amidino group, a hydrazine, a hydrazone, a carboxyl group and a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkinyl group, a substituted or unsubstituted $C_1$-$C_{60}$ alkoxyl group, a substituted or unsubstituted $C_3$-$C_{60}$ cycloalkyl group, a substituted or unsubstituted $C_6$-$C_{60}$ aryl group, a substituted or unsubstituted $C_6$-$C_{60}$ aryloxy group, or a substituted or unsubstituted $C_6$-$C_{60}$ arylthio group. For example, $R_{51}$ to $R_{58}$, $R_{61}$ to $R_{69}$, $R_{71}$, and $R_{72}$ may each independently be at least one of a hydrogen atom, a deuterium atom, a halogen atom, a hydroxyl group, a cyano group, a nitro group, an amino group, an amidino group, a hydrazine, a hydrazone, a carboxyl group and a salt thereof, a sulfonic acid group or a salt thereof, a phosphoric acid group or a salt thereof, a $C_1$-$C_{10}$ alkyl group (for example, a methyl group, an ethyl group, a propyl group, a butyl group, a pentyl group, a hexyl group, and the like) and the $C_1$-$C_{10}$ alkoxy group (for example, a methoxy group, an ethoxy group, a propoxy group, a butoxy group, a pentoxy group, and the like); $C_1$-$C_{10}$ alkyl group and the $C_1$-$C_{10}$ alkoxy group, substituted with a deuterium atom, a halogen atom, a hydroxyl group, a cyano group, a nitro group, an amino group, an amidino group, a hydrazine, a hydrazone, a carboxyl group and a salt thereof, a sulfonic acid group or a salt thereof and a phosphoric acid group or a salt thereof; phenyl group, naphthyl group, anthryl group, fluorenyl group and pyrenyl group; and phenyl group, naphthyl group, anthryl group, fluorenyl group and pyrenyl group, substituted with at least one of a deuterium atom, a halogen atom, a hydroxyl group, a cyano group, a nitro group, an amino group, an amidino group, a hydrazine, a hydrazone, a carboxyl group and a salt thereof, a sulfonic acid group or a salt thereof, a phosphoric acid group or a salt thereof, a $C_1$-$C_{10}$ alkyl group, or a $C_1$-$C_{10}$ alkoxy group, but are not limited thereto.

In Formula 300, $R_{59}$ may be a phenyl group, a naphthyl group, an anthryl group, a biphenyl group, a pyridyl group; and a phenyl group, a naphthyl group, an anthryl group, a biphenyl group and a pyridyl group, substituted with at least one of a deuterium atom, a halogen atom, a hydroxyl group, a cyano group, a nitro group, an amino group, an amidino group, a hydrazine, a hydrazone, a carboxyl group and a salt thereof, a sulfonic acid group or a salt thereof, a phosphoric acid group or a salt thereof, a substituted or unsubstituted $C_1$-$C_{20}$ alkyl group, a substituted or unsubstituted $C_1$-$C_{20}$ alkoxy group.

For example, the hole injection and transport layer 111 may include at least one of compound 301 to 320 below, but not limited thereto.

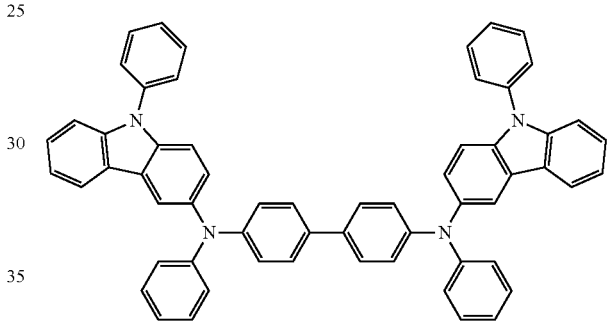

301

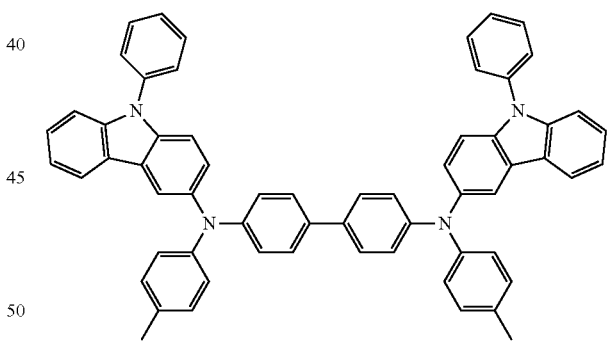

302

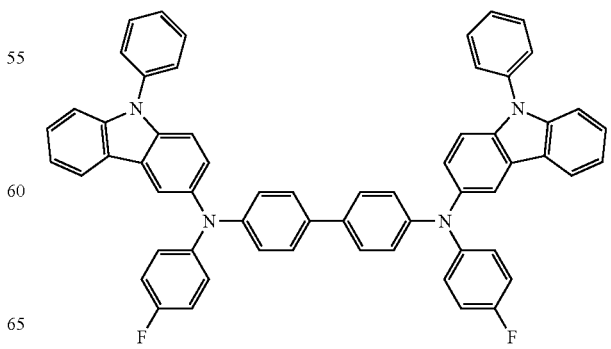

303

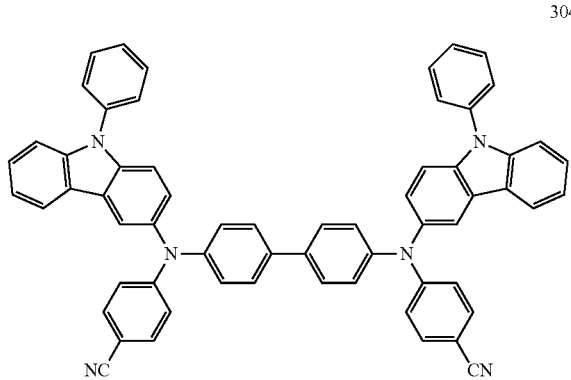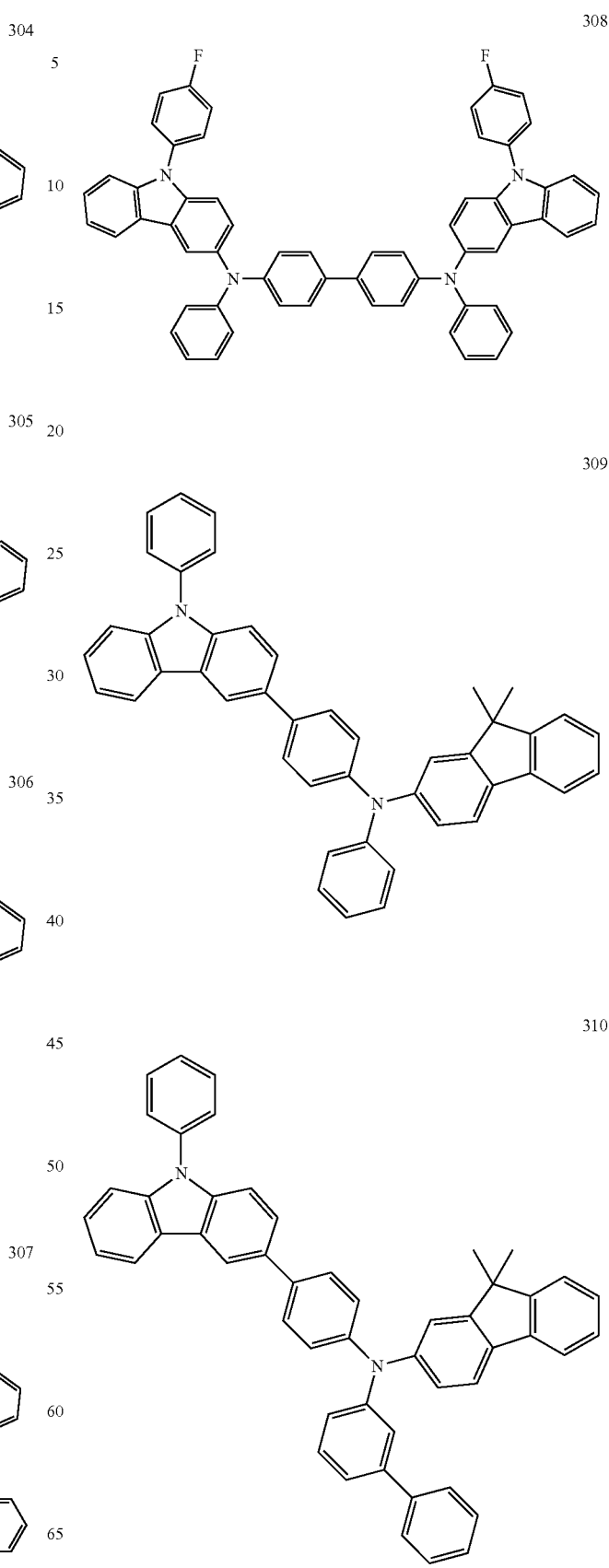

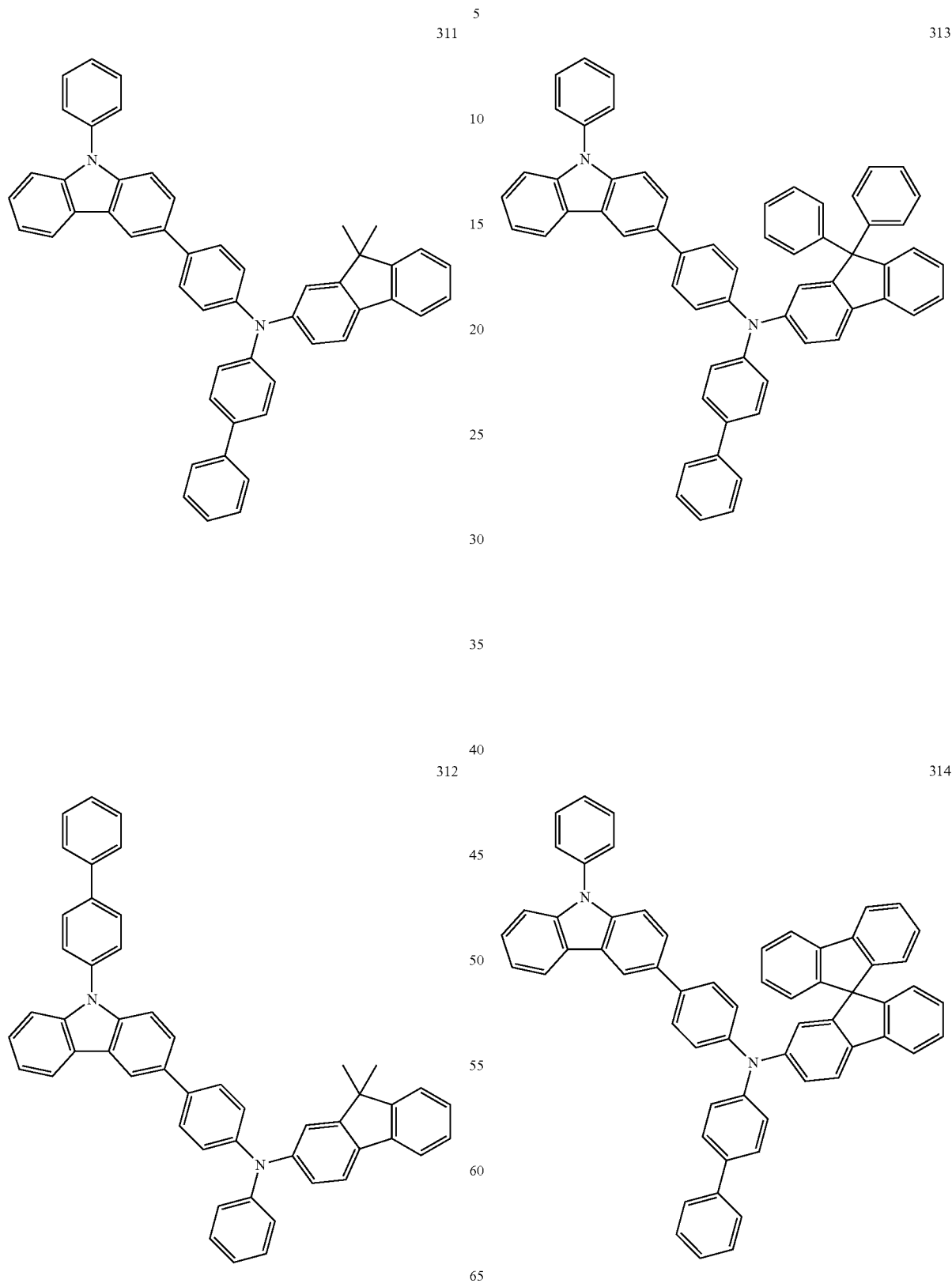

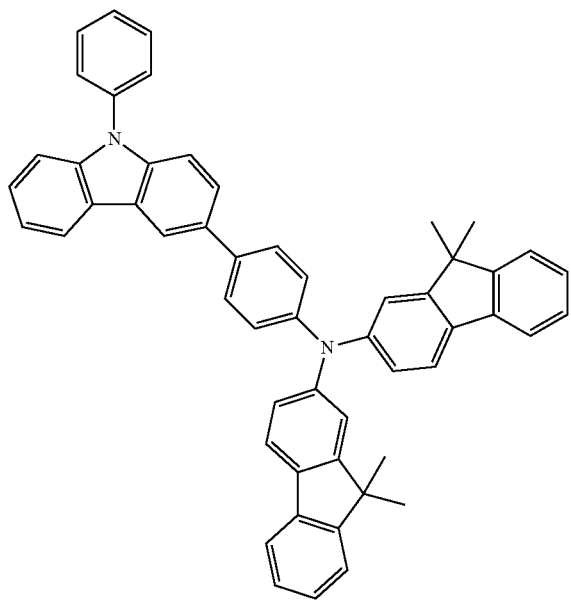
315
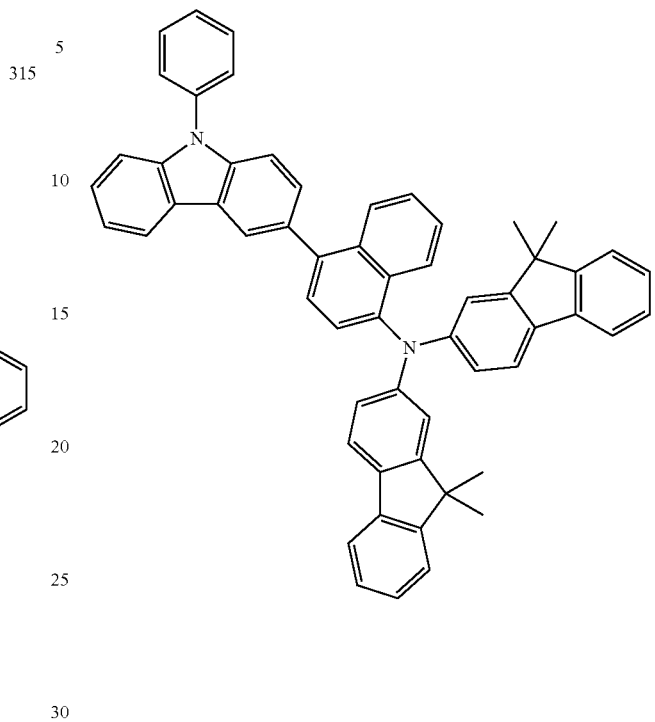
317
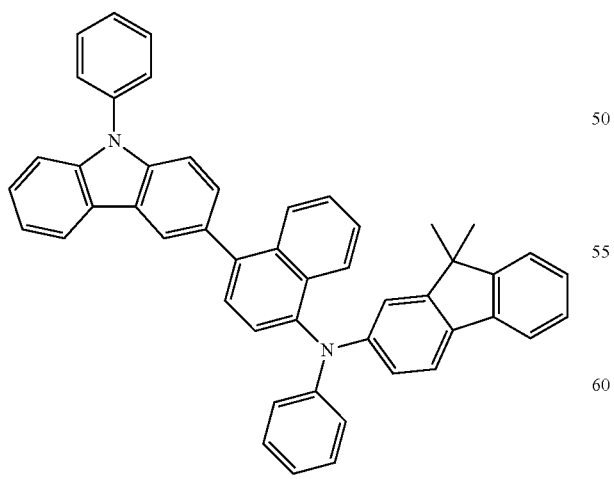
316
318

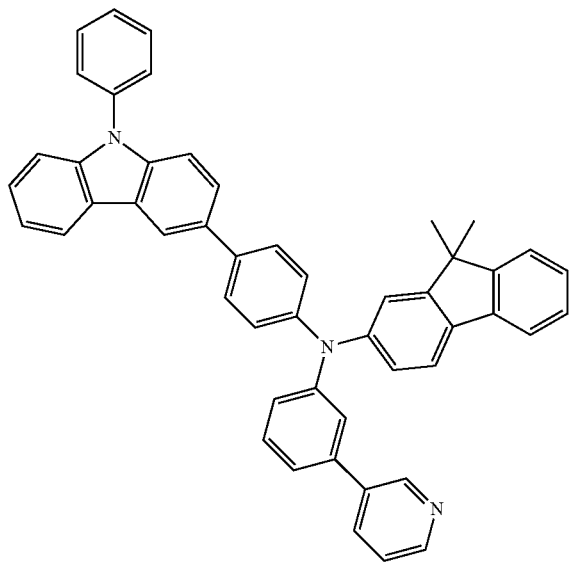

319

320

The thicknesses of the hole injection and transport layer 111 may be from about 100 Å to about 10 μm, and in some embodiments, may be from about 100 Å to about 2000 Å. When the thickness of the HIL is within these ranges, an organic light emitting electrode without a substantial increase in driving voltage may be manufactured.

The first layer 114 is formed on the hole injection and transport layer 111. The first layer 114 is a common layer including a light emitting material capable of emitting the light having a third color. The first layer 114 may be formed by using vacuum deposition, spin coating, casting, LB, inkjet printing, laser printing, LITI, or the like. If the first layer 114 is formed by using vacuum deposition or spin coating, conditions of deposition may vary according to materials used, however, ranges of conditions almost identical to those for manufacturing the hole injection and transport layer 111 may generally be selected.

When the light having a third color is blue light, the first layer 114 may include a known blue light emitting material. For example, the first layer 114 may include a known host and dopant.

Non-limiting examples of the known host are $Alq_3$, CBP (4,4'-N,N'-dicarbazole-biphenyl), 9,10-di(naphthalene-2-yl) anthracene (ADN), TPBI benzene (1,3,5-tris(N-phenylbenz-imidazole-2-yl)benzene), TBADN (3-tert-butyl-9,10-di(naphth-2-yl)anthracene).

The dopant may be at least one of a fluorescent dopant and a phosphorescent dopant. The phosphorescent dopant may be an organic metal complex including iridium (Ir), platinum (Pt), osmium (Os), rhenium (Re), titanium (Ti), zirconium (Zr), halfnium (Hf), or a combination of at least two of these elements, but not limited thereto.

Non-limiting examples of a blue dopant may comprise $F_2Irpic$, $(F_2ppy)_2Ir(tmd)$, $Ir(dfppz)_3$, ter-fluorene, 4,4'-bis[4-(diphenylamino)styryl]biphenyl (DPAVBi), 2,5,8,11-tetra-tert-butyl perylene (TBPe) and DPVBi.

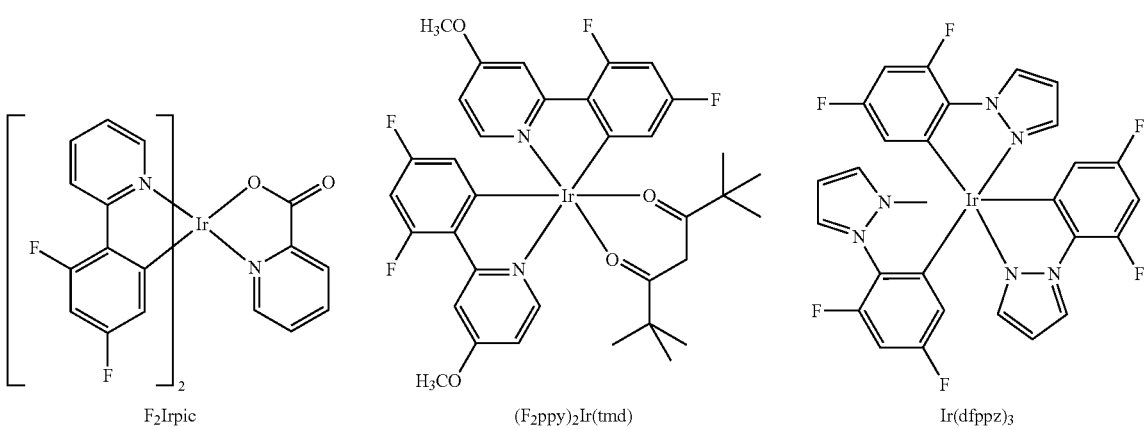

$F_2Irpic$       $(F_2ppy)_2Ir(tmd)$       $Ir(dfppz)_3$

-continued

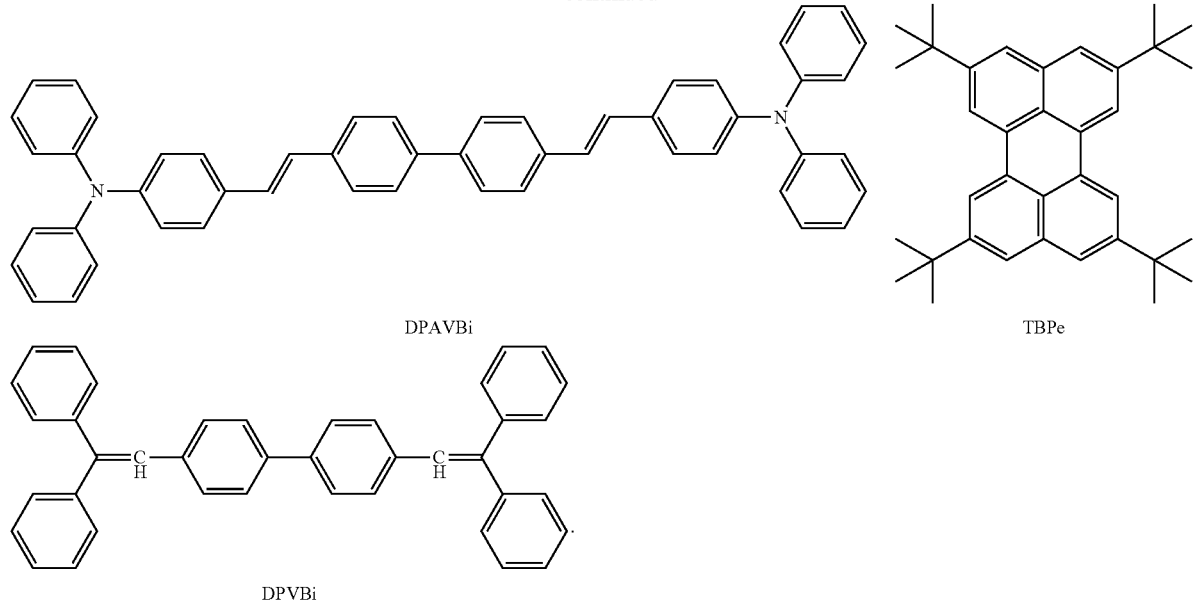

DPAVBi

TBPe

DPVBi

A thickness of the first layer 114 may be from about 100 Å to 500 Å and in some embodiments, may be from about 150 Å to about 300 Å. When the thickness of the first layer is within these ranges, an organic light emitting device 100 without a substantial increase in driving voltage may be manufactured.

Also, the first auxiliary layer 112a contacting with the first layer 114 and the second auxiliary layer 112b contacting with the first layer 114 are formed. The first auxiliary layer 112a and the second auxiliary layer 112b may be formed using a laser induced thermal imaging (LITI) technique.

The first auxiliary layer 112a includes a first metallic compound, and the second auxiliary layer 112b includes a second metallic compound, wherein the first metallic compound may be a metallic compound which makes a first thin film exclusively including (consisting of) the first metallic compound to have a thin film density of about 2 g/cm$^3$ or greater, and the second metallic compound may be a metallic compound which makes a second thin film exclusively including (consisting of) the second metallic compound to have a thin film density of about 2 g/cm$^3$ or greater.

For example, the first metallic compound and the second metallic compound may be oxidizing metallic compounds. Accordingly, each of the first auxiliary layer 112a and the second auxiliary layer 112b may have excellent conductivity and hole mobility, facilitating a transportation of injected holes from the first electrode 103 to a first EML 113a and a second EML 113b. As a result, the organic light emitting device 100 may have low driving voltage, high efficiency, high brightness, and the like.

For example, the first metallic compound and the second metallic compound may each independently be an oxide or a halide including at least one of Group 5 elements (for example, vanadium (V), niobium (Nb), tantalum (Ta), and the like), Group 6 elements (for example, chromium (Cr), molybdenum (Mo), tungsten (W), and the like), Group 7 elements (for example, manganese (Mn), technetium (Tc), rhenium (Re), iron (Fe), antimony (Sb), and copper (Cu). For example, the first metallic compound and the second metallic compound may each independently include at least one of tungsten oxide, vanadium oxide, molybdenum oxide, rhenium oxide, iron halide, tin halide, and copper halide.

According to an embodiment of the present invention, the first metallic compound and the second metallic compound may each independently include at least one compound selected from WO, $W_2O_3$, $WO_2$, $WO_3$, $W_2O_5$, VO, $V_2O_3$, $VO_2$, $V_2O_5$, MoO, $Mo_2O_3$, $MoO_2$, $MoO_3$, $Mo_2O_5$, $ReO_3$, $FeCl_3$, $SbCl_5$, and CuI.

The first auxiliary layer 112a may further include a first organic hole transport material, in addition to the first metallic compound described above, and the second auxiliary layer 112b may further include a second organic hole transport material, in addition to the second metallic compound.

The first organic hole transport material and the second organic hole transport material may be, for example, selected from materials that can be used for the hole injection and transport layer 111. For example, the first organic hole transport material and the second organic hole transport material may each independently include at least one compound represented by Formula 300 or Formula 350 above, but the present invention is not limited thereto.

When the first auxiliary layer 112a further includes the first organic hole transport material and when the second auxiliary layer 112b further includes the second organic hole transport material, materials included in the hole injection and transport layer 111, the first organic hole transport material and the second organic hole transport material may be the same or different from each other.

When the first auxiliary layer 112a further includes the first organic hole transport material, content of the first metallic compound in the first auxiliary layer 112a may be less than or equal to 30 wt %, for example, about 0.1 wt % to about 25 wt %, based on 100 wt % of the first auxiliary layer 112a. When the second auxiliary layer 112b further includes the second organic hole transport material, content of second metallic compound in the second auxiliary layer 112b may be less than or equal to 30 wt %, for example, about 0.1 wt % to about 25 wt %, based on 100 wt % of the second auxiliary layer 112b.

The first EML 113a is formed on the first auxiliary layer 112a, and the second EML 113b is formed on the second auxiliary layer 112b. According to an embodiment of the present invention, the light having a first color emitted from the first EML 113a may be red light, and the light having a second color emitted from the second EML 113b may be green light. Meanwhile, the light having a third color may be blue, wherein the light having a third color may be emitted from the first layer 114. The light having a third color may be emitted from the third subpixel region. In the first subpixel, excitons are formed by recombination of holes and electrons in the first EML 113a and not in the first layer 114. Likewise, in the second subpixel, excitons are formed by recombination of holes and electrons in the second EML 113b and not in the first layer 114. Lastly, in the third subpixel, excitons are formed by recombination of holes and electrons in the first layer 114. In other words, the excitons are not formed in the first layer 114 in either of the first subpixel or the second subpixel, and thus blue light does not emit from the first subpixel or the second subpixel. This phenomena is controlled by the first auxiliary layer 112a and the second auxiliary layer 112b. Accordingly, the organic light emitting device 100 may emit in a full color.

Light emitting materials included in the first EML 113a and the second EML 113b may be selected from known materials capable of emitting corresponding colored lights.

Non-limiting examples hosts that may be included in the first EML 113a and the second EML 113b are each independently Alq$_3$, CBP (4,4'-N,N'-dicarbazole-biphenyl), 9,10-di(naphthalene-2-yl)anthracene (ADN), TCTA, TPBI (1,3,5-tris(N-phenylbenzimidazole-2-yl)benzene), and TBADN (3-tert-butyl-9,10-di(naphth-2-yl)anthracene).

Meanwhile, green and red dopants may be at least one of a fluorescent dopant and a phosphorescent dopant. The phosphorescent dopant may be an organic metal complex including Ir, Pt, Os, Re, Ti, Zr, Hf, or a combination at least two of these elements, but not limited thereto.

Non-limiting examples of known green dopants are Ir(ppy)$_3$ (ppy=phenylpyridine), Ir(ppy)$_2$(acac), and Ir(mpyp)$_3$.

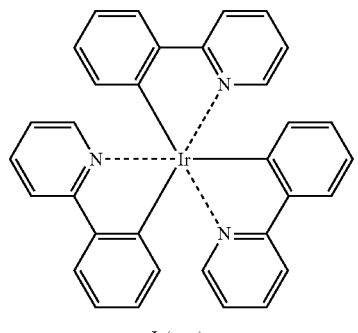

Ir(ppy)$_3$

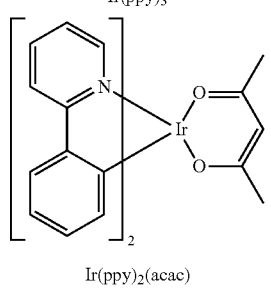

Ir(ppy)$_2$(acac)

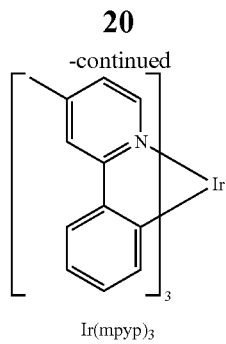

Ir(mpyp)$_3$

Non-limiting examples of known red dopants are PtOEP, Ir(piq)$_3$, and BtpIr

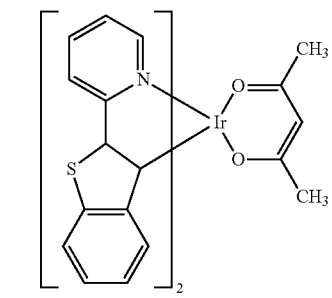

BtpIr

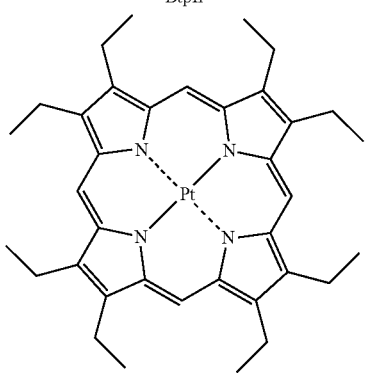

PtOEP

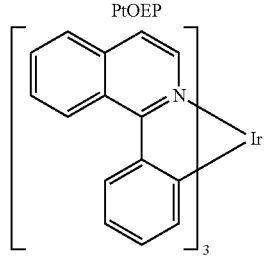

Ir(piq)$_3$ i) the first auxiliary layer 112a and the first EML 113a; and ii) the second auxiliary layer 112b and the second EML 113b; are separately patterned in the first subpixel region and the second subpixel region, respectively. When these layers are formed by using a LITI technique instead of a deposition technique, manufacturing steps using masks may be omitted, thereby reducing manufacturing costs.

An embodiment of forming i) the first auxiliary layer 112a and the first EML 113a; and ii) the second auxiliary layer 112b and the second EML 113b; is described below.

First, the substrate 101 on which plurality of first electrodes 103 may be formed and the hole injection and transport layer 111 and the first layer 114 may be formed over all of the first subpixel region, the second subpixel region, and the third subpixel region is provided.

Figure 2:
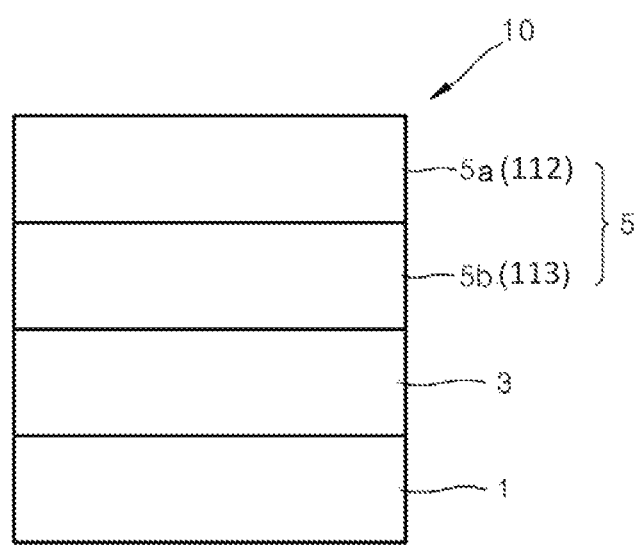
FIG. 2 is a cross-sectional view schematically showing a donor film for laser induced thermal imaging according to an embodiment of the present invention.

Thereafter, according to an embodiment, a donor film for LITI including a substrate layer 1, a light-to-heat conversion layer 3, and a transfer layer 5 as shown in FIG. 2 is provided.

The substrate layer 1 may have transparency to allow transfer of light to the light-to-heat conversion layer 3, and may include a material having sufficient mechanical stability. For example, the substrate layer 1 may be at least one polymer material selected from among polyester, polyacryl, polyepoxy, polyethylene, polystyrene, and polyethyleneterephthalate or glass.

The light-to-heat conversion layer 3 is a layer absorbing light from visible and/or infrared regions and converts the light into heat. The light-to-heat conversion layer 3 may have an appropriate optical density and may include an optical absorption material. The light-to-heat conversion layer 3 may include an inorganic thin film including aluminum (Al), silver (Ag), oxides thereof, or sulfides thereof or an organic thin film including a polymer including carbon black, graphite or an infrared dye. The light-to-heat conversion layer 3 may be formed by using vacuum deposition, electron beam deposition, or sputtering. In some embodiments, the light to heat conversion layer 3 may be formed using a general coating technique, such as roll coating, gravure, launching, spin coating, or knife coating, but the present invention is not limited thereto.

The transfer layer 5 is a layer transferred to a surface of the first layer 114 by being separated from the donor film for LITI 10 (i.e., the light-to-heat conversion layer 3) due to thermal energy transferred from the light-to-heat conversion layer 3. Accordingly, the transfer layer 5 may have a laminated structure in which an EML material containing layer 5b including materials for the first EML 113a or the second EML 113b, and auxiliary layer material containing layer 5a including materials for the first auxiliary layer 112a or the second auxiliary layer 112b are sequentially deposited from the light-to-heat conversion layer 3. Methods of manufacturing the EML material containing layer 5b and the auxiliary material containing layer 5a on the light-to-heat conversion layer 3 may include various techniques, for example, vacuum deposition, spin coating, casting, Langmuir-Blodget (LB), inkjet printing, laser printing, and the like. The materials included in each of the EML material containing layer 5b and the auxiliary layer material containing layer 5a may be the same as described with reference to the first EML 113a, the second EML 113b, the first auxiliary layer 112a, and the second auxiliary layer 112b. Accordingly, the auxiliary layer material containing layer 5a essentially includes the first metallic compound and/or the second metallic compound described above.

Thereafter, the donor film for LITI 10 is located and fixed on the first layer 114 such that the transfer layer 5 (i.e., the auxiliary layer material containing layer 5a) contacts with the first layer 114, laser is irradiated on the substrate layer 1 of the dopant film for LITI 10 to transfer the transfer layer 5 to the first layer 114, and the light-and-heat conversion layer 3 and the substrate layer 1 are removed to manufacture the first auxiliary layer 112a and the first EML 113a and/or the second auxiliary layer 112b and the second EML 113b.

The first auxiliary layer 112a and the first EML 113a and/or the second auxiliary layer 112b and the second EML 113b are layers separately patterned m the first subpixel region and the second subpixel region. Accordingly, when the layers are formed by using a LITI technique instead of deposition technique that involves complicated processes using masks, manufacturing costs and time may be reduced.

In this regard, since the transfer layer 5 that is already formed on the donor film for LITI 10 is transferred to the first layer 114, interfacial binding properties and planarizing properties between the first layer 114 and the first auxiliary layer 112a and between the first layer 114 and the second auxiliary layer 112b may deteriorate.

In this regard, inventors of the present invention discovered that when the first auxiliary layer 112a and the second auxiliary layer 112b are formed using a LITI technique, using inorganic materials capable of providing high density thin films such as the first metallic compound and the second metallic compound as described above, as oxidizing materials that are used in the first auxiliary layer 112a and the second auxiliary layer 112b to facilitate transfer of injected holes from the first electrode 103 to the first EML 113a and the second EML 113b, may achieve interfacial planarization between the first layer 114 and the first auxiliary layer 112a and between the first layer 114 and the second auxiliary layer 112b. Interfacial planarization means that the overall surface of the first layer 114 and the first auxiliary layer 112a are attached to each other effectively and that the overall surface of the first layer 114 and the second auxiliary layer 112b are attached to each other effectively. This interfacial planarization can make carriers be transported between the first layer 114 and the first auxiliary layer 112a and between the first layer 114 and the second auxiliary layer 112b more smoothly and thus can improve brightness uniformity of the OLED.

The first metallic compound may be a metallic compound which makes a first thin film exclusively including (consisting of) the first metallic compound to have a thin film density of 2 $g/cm^3$ or greater, and the second metallic compound may be a metallic compound which makes a second thin film exclusively including (consisting of) the second metallic compound to have a thin film density of 2 $g/cm^3$ or greater. The auxiliary layer material containing layer 5a may have a high density when including the first metallic compound or the second metallic compound.

When the auxiliary layer material containing layer 5a having a high density due to the inclusion of the first metallic compound and/or the second metallic compound as described above is transferred onto a surface of the first layer 114, adhesion between the auxiliary layer material containing layer 5a and the first layer 114 may be increased, leading to improved interfacial planarization between the first auxiliary layer 112a and the first layer 114, and between the second auxiliary layer 112b and the first layer 114. Accordingly, luminance non-uniformity, i.e., luminance mura, in the organic light emitting device 100 may substantially be prevented, so that the organic light-emitting device 100 may have high performance.

Thereafter, the electron transport layer 116, the electron injection layer 118, and the second electrode 119 are sequentially formed as common layers over the entirety of the first subpixel region, the second subpixel region, and the third pixel. The electron transport layer 116 may be formed by using vacuum deposition, spin coating, casting, LB, inkjet printing, laser printing, LITI, and the like.

The electron transport layer 116 may include a known organic electron transport material. For example, the electron transport layer 116 may include at least one compound from anthracene-based compounds represented by Formulae 10A, 10B, and 10C, and a compound represented by Formula 20A:

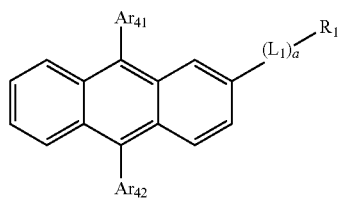
<Formula 10A>

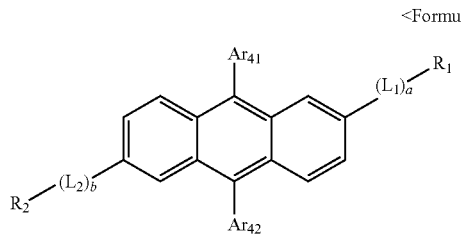
<Formula 10B>

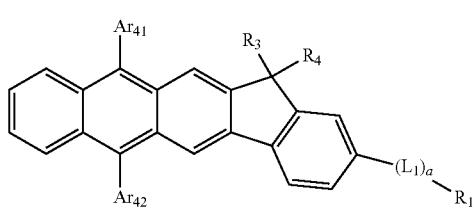
<Formula 10C>

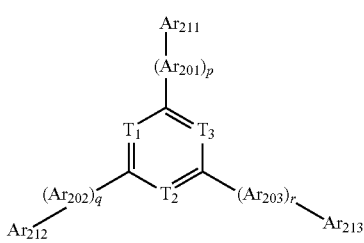
<Formula 20A>

In Formulas 10A to 10C, $Ar_{41}$ and $Ar_{42}$ may each independently be a substituted or unsubstituted $C_6$-$C_{60}$ aryl group or a substituted or unsubstituted $C_2$-$C_{60}$ heteroaryl group.

For example; the $Ar_{41}$ and $Ar_{42}$ may each independently be one of phenyl group, a naphthyl group, a anthryl group, a pyrenyl group, a fluorenyl group, a pyridinyl group, a pyrazinyl group, a pyrimidyl group; and a phenyl group, a naphthyl group, a anthryl group, a pyrenyl group, a fluorenyl group, a pyridinyl group, a pyrazinyl group and a pyrimidyl group, substituted with at least one of a phenyl group, a naphthyl group, an anthryl group, a pyrenyl group, a fluorenyl group, a pyridinyl group, a pyrazinyl group and a pyrimidyl group, but not limited thereto.

The $Ar_{41}$ and $Ar_{42}$ may be identical to each other, but not limited thereto.

$L_1$ and $L_2$ of Formulas 10A to 10C may each independently be a substituted or unsubstituted $C_6$-$C_{60}$ arylene groups or a substituted or unsubstituted $C_2$-$C_{60}$ heteroarylene groups.

For example, $L_1$ and $L_2$ may each independently be one of a phenylene group, a naphtyllene group, an anthrylene group, a pyrenyl group, a fluorenyl group, a pyridinyl group, a pyrazinyl group, and a pyrimidinylene group; and a phenylene group, a naphthylene group, an anthrylene group, a pyrenyl group, a fluorenyl group, a pyridinyl group, a pyrazinyl group and a pyrimidinyl group, substituted with at least one of a phenyl group, a naphthyl group, a anthryl group, a pyrenyl group, a fluorenyl group, a pyridinyl group, a pyrazinyl group, and a pyrimidinyl group, but not limited thereto.

In Formulas 10A to 10C, a and b may each independently be 0, 1, or 2. For example, in Formulas 10A to 10C, a and b may each independently be 0 or 1.

For example, $R_1$ and $R_2$ in Formulas 10A to 10C may be one of a benzoimidazoyl group, a benzoxazolyl group, a benzothiazolyl group, a benzopyrimidinyl group, an imidazopyridinyl group, a quinolyl group, an isoquinolyl group, a quinazolyl group, pyridinyl group, a pyrimidinyl group, a pyrazinyl group, a phenyl group, a naphthyl group, a pyrenyl group, a chrysenyl group, a fluorenyl group, and a phenanthrenyl group; and a benzoimidazoyl group, a benzoxazolyl group, a benzothiazolyl group, a benzopyrimidinyl group, an imidazopyridinyl group, a quinolyl group, a isoquinolyl group, a quinazolyl group, a pyridinyl group, a pyrimidinyl group, a pyrazinyl group, a phenyl group, a naphthyl group, a pyrenyl group, a chrysenyl group, a fluorenyl group and a phenanthrenyl group, substituted with at least one of a deuterium, -fluorine (—F), -chlorine (—Cl), -Bromine (—Br), -Iodine (—I), -cyanide (—CN), a hydroxyl group, a nitro group, an amino group, an amidino group, a hydrazine, a hydrazone, a carboxyl group or a salt thereof, a sulfonic acid or a salt thereof, a $C_1$-$C_{60}$ alkyl group, a $C_1$-$C_{60}$ alkoxy group, a $C_2$-$C_{60}$ alkenyl group, a $C_2$-$C_{60}$ alkinyl group, a $C_6$-$C_{60}$ aryl group, and a $C_2$-$C_{60}$ heteroaryl group.

$R_3$ and $R_4$ in Formula 10C may each independently be a methyl group, an ethyl group, a propyl group, a butyl group, a pentyl group, a hexyl group, a phenyl group, or a naphthyl group, but not limited thereto.

The organic electron transport materials included in the electron transport layer 116 may be one of Compounds 200 to 210 below, but not limited thereto:

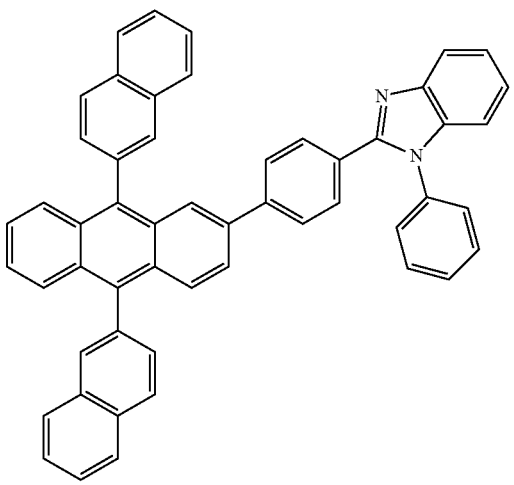
<Compound 200>

<Compound 201>
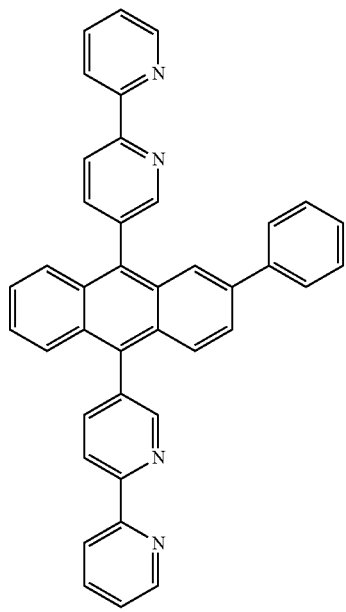
<Compound 202>
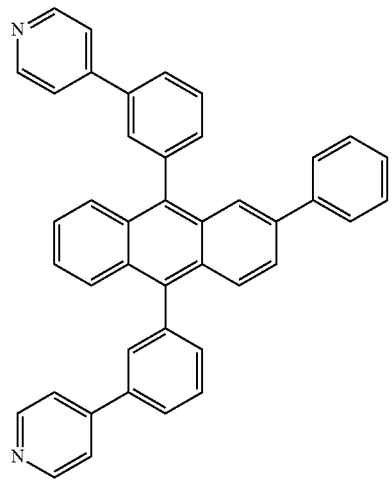
<Compound 203>
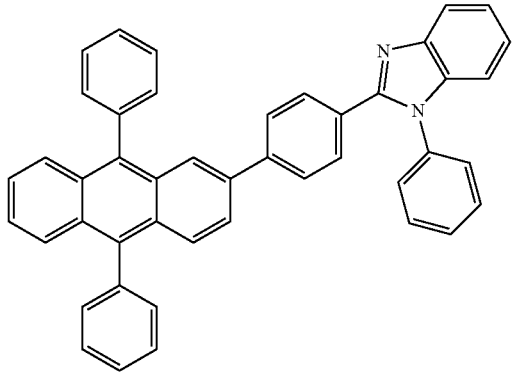
<Compound 204>
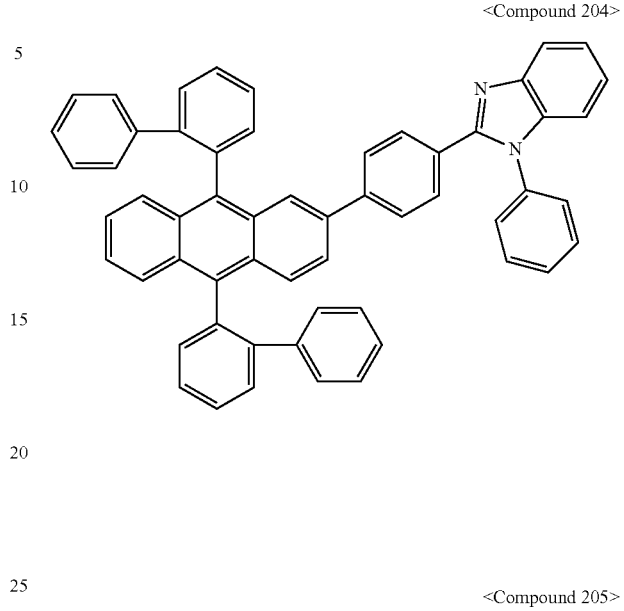
<Compound 205>
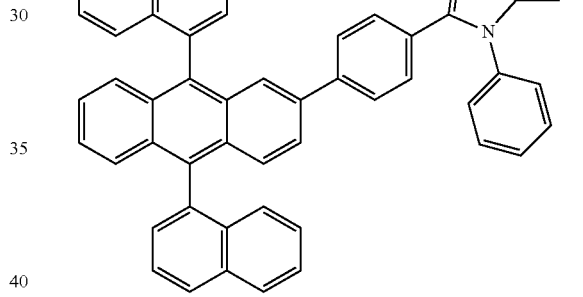
<Compound 206>
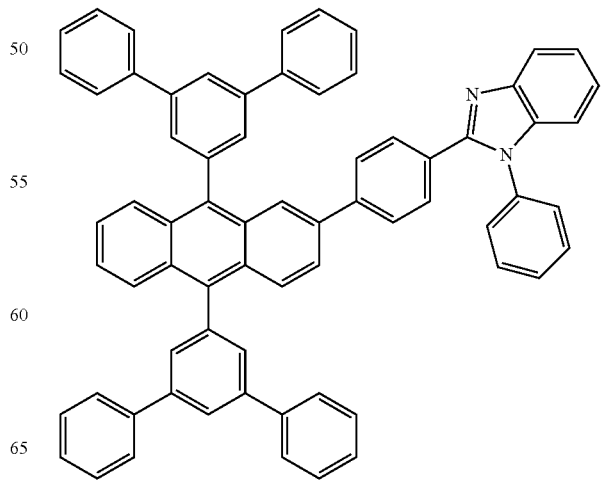

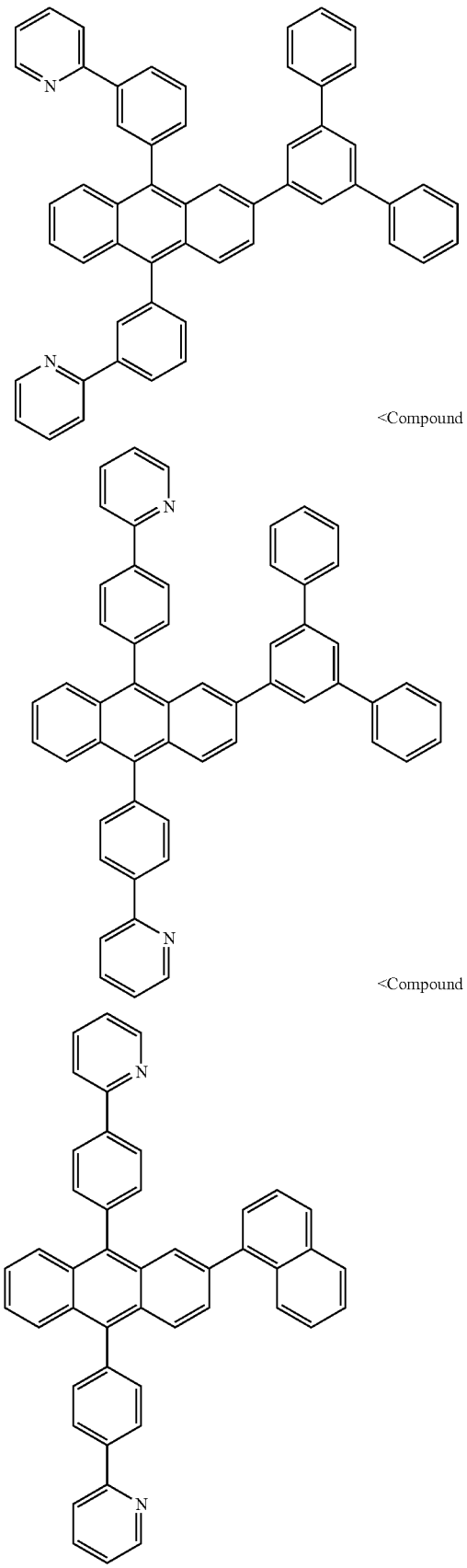

<Compound 207>
<Compound 208>
<Compound 209>

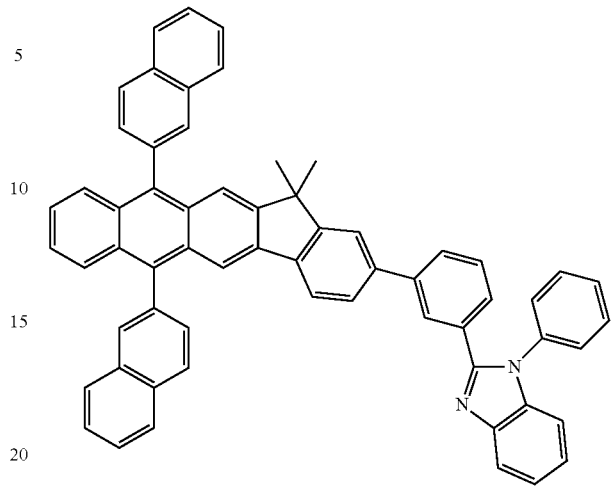

<Compound 210>

Meanwhile, $T_1$ to $T_3$ in Formula 20A may all be N; $T_1$ may be $C(R_{100})$; $T_2$ and $T_3$ may be N; or $T_1$ to $T_3$ may all be $C(R_{100})$, but are not limited thereto.

$Ar_{201}$ to $Ar_{203}$ in Formula 20A may each independently be a substituted or unsubstituted $C_6$-$C_{60}$ arylene group, or a substituted or unsubstituted $C_2$-$C_{60}$ heteroarylene group. The $Ar_{201}$ to $Ar_{203}$ may each independently be a phenylene group, a naphthylene group, an anthrylene group, a pyrenylene group, a fluorenylene group, a pyridinylene group, a pyrazinylene group, and a pyrimidinylene group; and a phenylene group, a naphthylene group, an anthrylene group, a pyrenylene group, a fluorenylene group, a pyridinylene group, a pyrazinylene group, and a pyrimidinylene group, substituted with at least one of a phyenyl group, a naphthyl group, an anthryl group, a pyrenyl group, a fluorenyl group, a pyridinyl group, a pyrazinyl group and a pyrimidinyl group, but are not limited thereto.

p, q, and r in Formula 20A may each independently be 0, 1, or 2. For example, p, q, and r in Formula 20A may each independently be 0 or 1, but are not limited thereto.

$Ar_{211}$ to $Ar_{213}$ in Formula 20A may each independently be substituted or unsubstituted $C_6$-$C_{60}$ aryl group, or substituted or unsubstituted $C_2$-$C_{60}$ heteroaryl group. For example, $Ar_{211}$ to $Ar_{213}$ may each independently a substituted or unsubstituted benzoimidazolyl group, a substituted or unsubstituted benzoxazolyl group, a substituted or unsubstituted benzothiazolyl group, a substituted or unsubstituted benzopyrimidinyl group, a substituted or unsubstituted imidazopyridinyl group, a substituted or unsubstituted quinolyl group, a substituted or unsubstituted isoquinolyl group, a substituted or unsubstituted quinazolyl group, a substituted or unsubstituted pyridinyl group, a substituted or unsubstituted pyrimidinyl group, a substituted or unsubstituted pyrazinyl group, a substituted or unsubstituted phenyl group, a substituted or unsubstituted naphthyl group, a substituted or unsubstituted pyrenyl group, a substituted or unsubstituted chrysenyl group, a substituted or unsubstituted fluorenyl group, or a substituted or unsubstituted phenanthrenyl group.

According to an embodiment of the present invention, the organic electron transport material included in the electron transport layer 116 may be selected from among Compounds 600 to 604 below, but is not limited thereto:

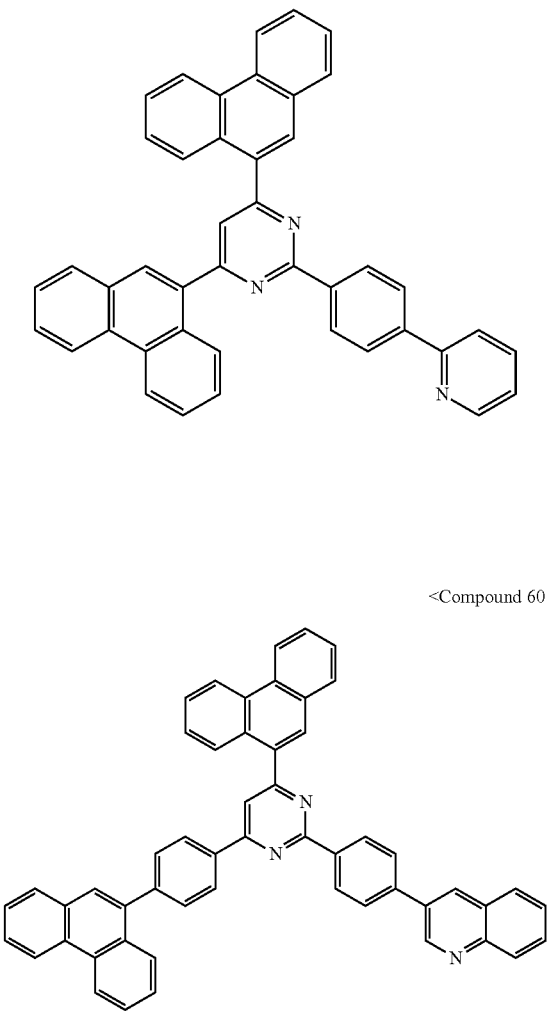

<Compound 600>

<Compound 601>

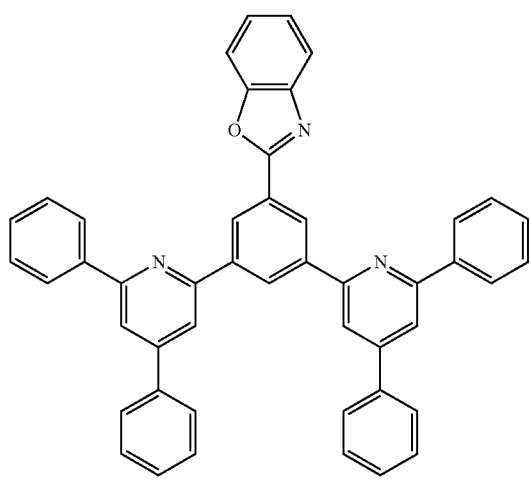

<Compound 602>

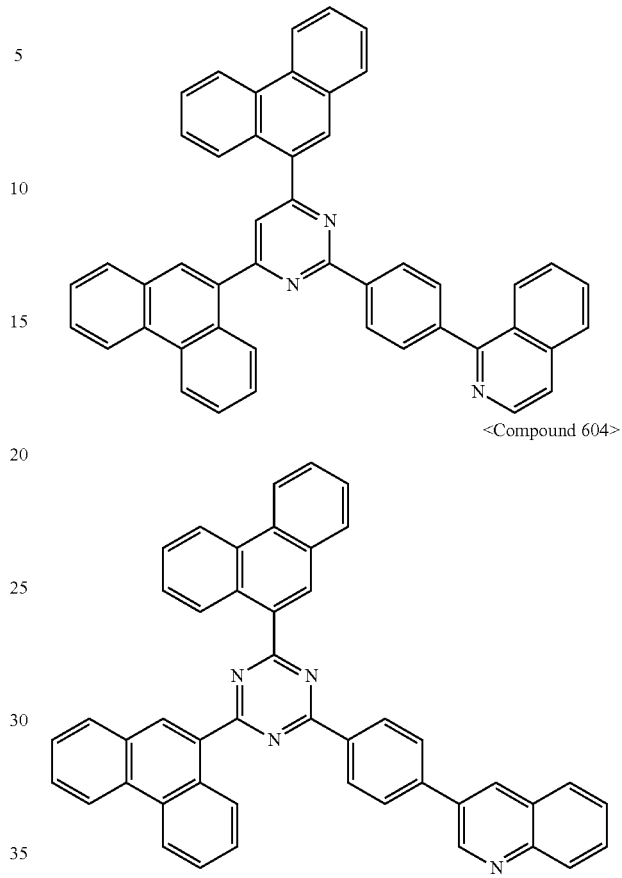

<Compound 603>

<Compound 604>

Meanwhile, the electron transport layer 116 may further include lithium complexes such as lithium quinolate, in addition to the organic electron transport materials described above.

A thickness of the electron transport layer 116 may be from about 300 Å to about 500 Å, and in some embodiments, may be from about 300 Å to about 400 Å. When the thickness of the electron transport layer 116 is within these ranges, satisfactory electron transport capabilities may be obtained without a substantial increase in driving voltage.

The electron injection layer 118 may use a known random material, for example, materials facilitating injection of electrons from the second electrode 119, for example, LiF, NaCl, CsF, $Li_2O$, BaO, or the like. The deposition conditions may vary according to the material used for forming the electron injection layer 118; however, conditions may generally be selected from ranges almost identical to manufacturing the hole injection and transport layer 111.

The thickness of the electron injection layer 118 may be from about 1 Å to about 100 Å, and in some embodiments, may be from about 3 Å to about 90 Å. When the thickness of the electron injection layer 118 is within these ranges, satisfactory electron injecting capabilities may be obtained without a substantial increase in driving voltage.

The second electrode 119 is formed as a common layer on the electron injection layer 118. The second electrode 119 may be a cathode that is an electron injection electrode. In this regard, the second electrode 119 may be formed of metal, an alloy, an electrically conductive compound, or a combination thereof that have a low work function. For example, the second electrode 119 may be formed as transparent electrode, a semi-transparent electrode, or a reflective electrode, using lithium (Li), magnesium (Mg), aluminum (Al), aluminum-lithium (Al—Li), calcium (Ca), magnesium-indium (Mg—In), magnesium-silver (Mg—Ag), or the like.

Figure 3:
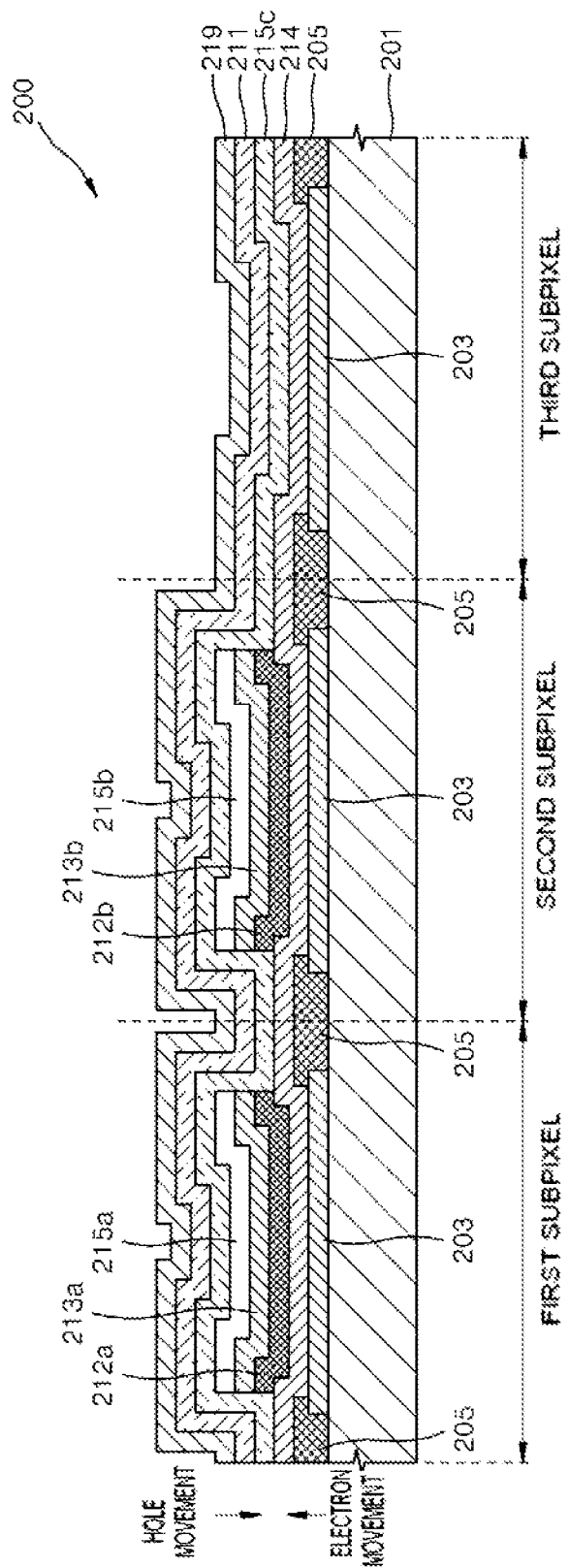
FIG. 3 is a cross-sectional view schematically showing an organic light emitting device according to a second embodiment of the present invention.

Turning now to FIG. 3, FIG. 3 illustrates an organic light emitting display device 200 according to a second embodiment of the present invention. Referring now to FIG. 3, a substrate 201 of an organic light emitting device 200 includes a first subpixel region, a second subpixel region, and a third subpixel region. A plurality of first electrodes 203 are formed as separate patterns in the first subpixel region, the second subpixel region, and the third subpixel region, respectively. A pixel defining layer 205 is formed on an edge of each of the first electrodes 203 to define the first subpixel region, the second subpixel region, and the third subpixel region. The first layer 214 is formed as a common layer over the entirety of the first subpixel region, the second subpixel region, and the third subpixel region. In the first subpixel region, a first auxiliary layer 212a contacting with a surface of the first layer 214 is formed, a first EML 213a emitting light having a first color is formed on the first auxiliary layer 212a, and a first resonance control layer 215a is formed on the first EML 213a. Meanwhile, in the second subpixel region, a second auxiliary layer 212b contacting with a surface of the first layer 214 is formed, a second EML 213b emitting light having a second color is formed on the second auxiliary layer 212b, and a second resonance control layer 215b is formed on the second EML 213b. Also, a second layer 215c including a light emitting material capable of emitting light having a third color, a hole injection and transport layer 211, and a second electrode 219 are laminated sequentially as common layers over the entirety of the first subpixel region, the second subpixel region, and the third subpixel region. The first electrode 203 in the organic light emitting device 200 in FIG. 2 is an electrode for injecting electrons, the second electrode 119 is an electrode for injecting holes, and directions of movements of the electrons and holes are shown in FIG. 3.

In FIG. 3, the light having a first color, the light having a second color, and the light having a third color may be, for example, red, green and blue, respectively. Accordingly, the organic light emitting device 200 may emit in a full color. The light having a first color, the light having a second color, and the light having a third color may be in any of a variety of colors, not limited to the red light, the green light, and the blue light provided that a mixed light thereof may be a white light.

The substrate 201 and the pixel defining layers 205 may be the same as described with reference to the substrate 101 and the pixel defining layers 105 in FIG. 1.

The plurality of the first electrodes 203 in FIG. 3 are electron injection electrodes. The first electrodes 203 may be the same as described with reference to the second electrode 119 in FIG. 2, except that the first electrodes 203 are formed as separate patterns in the subpixel regions, respectively.

The first layer 214 in FIG. 3 is an electron transport layer. For detailed descriptions of the organic electron transport materials and the like that may be included in the first layer 214 are the same as described with reference to the electron transport layer 116 in FIG. 1.

The first auxiliary layer 212a, the first EML 213a, and the first resonance control layer 215a are formed sequentially in the first subpixel region in FIG. 3. The second auxiliary layer 212b, the second EML 213b and the second resonance control layer 215b are formed sequentially in the second subpixel region.

The first auxiliary layer 212a and the second auxiliary layer 212b may be formed to contact a surface of the first layer 214, and may be formed by using a LITI technique. The first auxiliary layer 212a may include a first metallic compound, and the second auxiliary layer 212b may include a second metallic compound. The first metallic compound may be a metallic compound which makes a first thin film exclusively including (consisting of) the first metallic compound to have a thin film density of 2 g/cm³ or greater, and the second metallic compound may be a metallic compound which makes a second thin film exclusively including (consisting of) the second metallic compound to have a thin film density of 2 g/cm³ or greater.

For example, the first metallic compound and the second metallic compound may be reducing metallic compounds. As a result, each of the first auxiliary layer 212a and the second auxiliary layer 212b may have excellent conductivity and electron mobility, facilitating a transportation of the injected electrons from the first electrodes 203 to the first EML 213a and the second EML 213b. Accordingly, the organic light emitting device 200 may have low driving voltage, high efficiency, and high luminance.

The first metallic compound and the second metallic compound may each independently be a halide (for example, fluoride, chloride, and iodide), an oxide, a nitride, a oxynitride, or a salt (for example, carbonate and the like) including at least one of alkali metals (for example, lithium (Li), sodium (Na), potassium (K), rubidium (Rb), cesium (Cs), and the like) and alkaline earth metals (for example, beryllium (Be), magnesium (Mg), calcium (Ca), strontium (Sr), barium (Ba), and the like). The first metallic compound and the second metallic compound may further include at least one of aluminum (Al), boron (B), tungsten (W), and silicon (Si), in addition to the above-described alkali metals and alkaline earth metals.

For example, the first metallic compound and the second metallic compound may each independently include at least one compound selected from among lithium fluoride, potassium fluoride, cesium fluoride, rubidium fluoride, lithium oxide, rubidium oxide, cesium oxide, lithium aluminate, lithium borate, lithium chloride, rubidium chloride, sodium chloride, potassium chloride, potassium aluminate, sodium tungsten oxide, potassium silicon oxide, lithium carbonate, sodium carbonate, potassium carbonate, rubidium carbonate, cesium carbonate, beryllium carboxide, beryllium carbonate, magnesium carboxide, magnesium carbonate, calcium oxide, calcium carbonate, strontium carboxide, strontium carbonate, barium carboxide, and barium carbonate.

According to an embodiment of the present invention, the first metallic compound and the second metallic compound may each independently include at least one of LiF, KF, CsF, RbF, NaF, $LiO_2$, $Li_2O_2$, $Rb_2O_2$, $Cs_2O$, $LiAlO_2$, $LiBO_2$, LiCl, RbCl, NaCl, KCl, CsCl, $KAlO_2$, $Na_2WO_4$, $K_2SiO_3$, $Li_2CO_3$, $LiCO_3$, $Na_2CO_3$, $NaCO_3$, $K_2CO_3$, $KCO_3$, $RbCO_3$, $RbCO_3$, $Cs_2CO_3$, $CsCO_3$, BeCO, $BeCO_3$, MgCO, $MgCO_3$, CaO, $Ca_2CO_3$, $CaCO_3$, SrCO, $SrCO_3$, BaCO and $BaCO_3$.

The first auxiliary layer 212a may further include the first organic electron transport material in addition to the first metallic compound, and the second auxiliary layer 212b may further include a second organic electron transporting material in addition to the second metallic compound, respectively.

The first organic electron transport material and the second electron transport material may be, for example, selected from materials capable of being used for the electron transport layer 116 in FIG. 1. When the first auxiliary layer 212a further includes a first organic electron transport material and the second auxiliary layer 212b further includes a second organic electron transport material, the materials included in the first layer 214, the first organic electron transport material, and the second organic electron transport material may be the same or different each other.

When the first auxiliary layer 212a further includes a first organic electron transport material, content of the first metallic compound in the first auxiliary layer 212a may be less than or equal to about 30 wt %, for example, from about 0.1 wt % to about 25 wt %, based on 100 wt % of the first auxiliary layer 212a. When the second auxiliary layer further includes a second organic electron transport material, content of the second metallic compound in the second auxiliary layer 212b may be less than about 30 wt %, for example, from about 0.1 wt % to about 25 wt %, based on 100 wt % of the second auxiliary layer 212b.

The first EML 213a is formed on the first auxiliary layer 212a, and the second EML 213b is formed on the second auxiliary layer 212b. According to an embodiment of the present invention, the light having a first color emitted from the first EML 213a may be red light, and the light having a second color emitted from the second EML 213b may be green light. Meanwhile, the light having a third color may be blue light emitted from the third subpixel region, for example, from the second layer 215c located in the third subpixel region. Accordingly, the organic light emitting device 200 may emit in a full color.

The first EML 213a may be the same as described with reference to the first EML 113a in FIG. 1, and the second EML 213b may be the same as described with reference to the first EML 113b in FIG. 1.

The first resonance control layer 215a provides a resonance pathway for efficiently emitting the light having a first color out of the organic light emitting device due to constructive interference, and the second resonance control layer 215b provides a resonance pathway for efficiently emitting the light having a second color out of the organic light emitting device due to constructive interference. The materials that may be included in the first resonance control layer 215a and the second resonance control layer 215b may be the same as described with reference to the materials that may be included in the hole injection and transport layer 111 in FIG. 1. In the second embodiment of FIG. 3, each of i) the first auxiliary layer 212a, the first EML 213a and the first resonance control layer 215a; and ii) the second auxiliary layer 212b, the second EML 213a, and the second resonance layer 215b are layers separately patterned in the first subpixel region and the second subpixel region, and if these layers are formed by using a LITI technique, processes such as mask using process may be omitted, resulting in a reduced manufacturing cost. Herein, using inorganic materials capable of providing high density thin films such as the first metallic compound and the second metallic compound as described above, as reducing materials that are used in the first auxiliary layer 212a and the second auxiliary layer 212b to facilitate transfer of injected electrons from the first electrode 203 to the first EML 213a and the second EML 213b, may achieve interfacial planarization between the first layer 214 and the first auxiliary layer 212a and between the first layer 214 and the second auxiliary layer 212b. Accordingly, luminance non-uniformity, i.e., luminance mura, in the organic light emitting device 200 is substantially prevented, so that the organic light-emitting device 200 may have high performance.

Thereafter, the second layer 215c, the hole injection and transport layer 211, and the second electrode 219 are common layers that are sequentially formed over the entirety of the first subpixel region, the second subpixel region, and the third subpixel region. The second layer 215c may include a light emitting material capable of emitting the light having a third color, and the materials included in the second layer 215c may be same as described with reference to the materials included in the first layer 114 in FIG. 1, and the hole injection and transport layer 211 may be the same as described with reference to the hole injection and transport layer 111 in FIG. 1. The second electrode 219 may be the same as described with reference to the first electrodes 103 in FIG. 1, except that the second electrode 219 is formed as a common layer.

Although described with reference to the organic light emitting devices of FIGS. 1 to 3, embodiments of the present invention are not limited thereto. For example, the organic light emitting device 200 in FIG. 3 may be modified not to include the first resonance control layer 215a and/or the second resonance control layer 215b.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. An organic light emitting device, comprising:
 a substrate including a first subpixel region, a second subpixel region, and a third subpixel region;
 a plurality of first electrodes separately arranged in the first subpixel region, the second subpixel region, and the third subpixel region of the substrate;
 a second electrode arranged opposite the first electrode;
 a first emission layer (EML) arranged in the first subpixel region to emit light having a first color;
 a second emission layer arranged in the second subpixel region to emit light having a second color;
 a first layer arranged as a common layer with respect to the first subpixel region, the second subpixel region, and the third subpixel region and arranged under the first emission layer and the second emission layer and arranged between the substrate and each of the first and second emission layers; and
 at least one of a first auxiliary layer and a second auxiliary layer, wherein the first auxiliary layer is arranged between the first emission layer and the first layer, contacts a surface of the first layer and includes a first metallic compound to facilitate transportation of electric charges from the first electrode to the first emission layer, and wherein the second auxiliary layer is arranged between the second emission layer and the first layer, contacts the surface of the first layer and includes a second metallic compound to facilitate transportation of electric charges from the first electrode to the second emission layer.

2. The organic light emitting device of claim 1, wherein the first auxiliary layer and the second auxiliary layer are produced by a laser induced thermal imaging process.

3. The organic light emitting device of claim 1, wherein the first metallic compound is a metallic compound which makes a first thin film exclusively including the first metallic compound have a thin film density of 2 $g/cm^3$ or greater, and the second metallic compound is a metallic compound which makes a second thin film exclusively including the second metallic compound have a thin film density of 2 $g/cm^3$ or greater.

4. The organic light emitting device of claim 1, wherein the first electrode is a hole injection electrode;
 the first layer comprises a light emitting material to emit light having a third color;
 the first metallic compound and the second metallic compound are oxidizing metallic compounds; and
 the second electrode is an electron injection electrode.

5. The organic light emitting device of claim 4, wherein the first metallic compound and the second metallic compound are each independently an oxide or a halide comprising at least one element selected from a group consisting of a Group 5 element, a Group 6 element, a Group 7, iron (Fe), antimony (Sb), and copper (Cu).

6. The organic light emitting device of claim 5, wherein the first metallic compound and the second metallic compound each independently comprise at least one compound selected from WO, $W_2O_3$, $WO_2$, $WO_3$, $W_2O_5$, VO, $V_2O_3$, $VO_2$, $V_2O_5$, MoO, $Mo_2O_3$, $MoO_2$, $MoO_3$, $Mo_2O_5$, $ReO_3$, $FeCl_3$, $SbCl_5$, and CuI.

7. The organic light emitting device of claim 4, wherein the first auxiliary layer further comprises a first organic hole transport material, and the second auxiliary layer further comprises a second organic hole transport material.

8. The organic light emitting device of claim 4, wherein the first color is red, the second color is green, and the third color is blue, wherein light having the third color is emitted from the first layer.

9. The organic light emitting device of claim 1, further comprising a second layer arranged between the first layer and the second electrode and being arranged as a common layer with respect to the first subpixel region, the second subpixel region, and the third subpixel region, the second layer comprising a light emitting material to emit light having a third color, wherein:
the first electrodes are electron injection electrodes;
the first layer is an electron transport layer;
the first metallic compound and the second metallic compound are reducing metallic compounds; and
the second electrode is a hole injection electrode.

10. The organic light emitting device of claim 9, wherein the first metallic compound and the second metallic compound are each independently selected from a halide, an oxide, a nitride, an oxynitride, and a salt comprising at least one of an alkali metal and an alkaline earth metal.

11. The organic light emitting device of claim 9, wherein the first metallic compound and the second metallic compound each independently comprises at least one compound selected from LiF, KF, CsF, RbF, NaF, $LiO_2$, $Li_2O_2$, $Rb_2O_2$, $Cs_2O$, $LiAlO_2$, $LiBO_2$, LiCl, RbCl, NaCl, KCl, CsCl, $KAlO_2$, $Na_2WO_4$, $K_2SiO_3$, $Li_2CO_3$, $LiCO_3$, $Na_2CO_3$, $NaCO_3$, $K_2CO_3$, $KCO_3$, $RbCO_3$, $RbCO_3$, $Cs_2CO_3$, $CsCO_3$, BeCO, $BeCO_3$, MgCO, $MgCO_3$, CaO, $Ca_2CO_3$, $CaCO_3$, SrCO, $SrCO_3$, BaCO, and $BaCO_3$.

12. The organic light emitting device of claim 1, wherein the first auxiliary layer further comprises a first organic electron transport material and the second auxiliary layer further comprises a second organic electron transport material.

13. The organic light emitting device of claim 9, wherein the first color is red, the second color is green, the third color is blue, and light having the third color is emitted from the second layer.

14. A method of manufacturing an organic light emitting device, comprising:
forming a plurality of first electrodes in a first subpixel region, a second subpixel region, and a third subpixel region, respectively on a substrate;
forming a first layer as a common layer with respect to the first subpixel region, the second subpixel region, and the third subpixel region;
forming at least one of a first auxiliary layer and a second auxiliary layer, wherein the first auxiliary layer is arranged between a first emission layer and the first layer, contacts a surface of the first layer and includes a first metallic compound to facilitate transportation of electric charges from the first electrode to the first emission layer, and wherein the second auxiliary layer is arranged between a second emission layer and the first layer, contacts the surface of the first layer and includes a second metallic compound to facilitate transportation of electric charges from the first electrode to the second emission layer;
forming the first emission layer in the first subpixel region to emit light of a first color;
forming the second emission layer in the second subpixel region to emit light of a second color; and
forming a second electrode opposite to the first electrodes.

15. The method of claim 14, wherein the first auxiliary layer and the second auxiliary layer are formed by a laser induced thermal imaging technique.

16. The method of claim 14, wherein the first metallic compound is a metallic compound which makes a first thin film exclusively including the first metallic compound to have a thin film density of 2 $g/cm^3$ or greater, and the second metallic compound is a metallic compound which makes a second thin film exclusively including the second metallic compound to have a thin film density of 2 $g/cm^3$ or greater.

17. The method of claim 14, wherein:
the first electrodes are hole injection electrodes;
the first layer is a common layer comprising a light emitting material to emit light of a third color;
the first metallic compound and the second metallic compound are oxidizing metallic compounds; and
the second electrode is an electron injection electrode.

18. The method of claim 17, wherein the first metallic compound and the second metallic compound each independently comprise at least one material selected from WO, $W_2O_3$, $WO_2$, $WO_3$, $W_2O_5$, VO, $V_2O_3$, $VO_2$, $V_2O_5$, MoO, $Mo_2O_3$, $MoO_2$, $MoO_3$, $Mo_2O_5$, $ReO_3$, $FeCl_3$, $SbCl_5$, and CuI.

19. The method of claim 14, further comprising forming a second layer between the first layer and the second electrode, the second layer being a common layer with respect to the first subpixel region, the second subpixel region, and the third subpixel region, the second layer including a light emitting material to emit light of a third color, wherein:
the first electrodes are electron injection electrodes;
the first layer is an electron transport layer;
the first metallic compound and the second metallic compound are reducing metallic compounds; and
the second electrode is a hole injection electrode.

20. The method of claim 19, wherein the first metallic compound and the second metallic compound each independently comprises at least one material selected from LiF, KF, CsF, RbF, NaF, $LiO_2$, $Li_2O_2$, $Rb_2O_2$, $Cs_2O$, $LiAlO_2$, $LiBO_2$, LiCl, RbCl, NaCl, KCl, CsCl, $KAlO_2$, $Na_2WO_4$, $K_2SiO_3$, $Li_2CO_3$, $LiCO_3$, $Na_2CO_3$, $NaCO_3$, $K_2CO_3$, $KCO_3$, $RbCO_3$, $RbCO_3$, $Cs_2CO_3$, $CsCO_3$, BeCO, $BeCO_3$, MgCO, $MgCO_3$, CaO, $Ca_2CO_3$, $CaCO_3$, SrCO, $SrCO_3$, BaCO and $BaCO_3$.

* * * * *